US00RE42588E

(19) United States
(12) Reissued Patent
Fallon et al.

(10) Patent Number: US RE42,588 E
(45) Date of Reissued Patent: Aug. 2, 2011

(54) CONTROL SYSTEM FOR A TWO CHAMBER GAS DISCHARGE LASER SYSTEM

(75) Inventors: John P. Fallon, Andover, MA (US); Richard L. Sandstrom, Encinitas, CA (US); William N. Partlo, Poway, CA (US); Alexander I. Ershov, Escondido, CA (US); Toshihiko Ishihara, San Diego, CA (US); John Meisner, San Diego, CA (US); Richard M. Ness, San Diego, CA (US); Paul C. Melcher, El Cajon, CA (US); John A. Rule, Hingham, MA (US); Robert N. Jacques, San Diego, CA (US)

(73) Assignee: Cymer, Inc., San Diego, CA (US)

(21) Appl. No.: 11/352,522

(22) Filed: Feb. 10, 2006

Related U.S. Patent Documents

Reissue of:
(64) Patent No.: 6,690,704
Issued: Feb. 10, 2004
Appl. No.: 10/210,761
Filed: Jul. 31, 2002

U.S. Applications:
(63) Continuation-in-part of application No. 10/187,336, filed on Jun. 28, 2002, now Pat. No. 6,914,919, which is a continuation-in-part of application No. 10/141,216, filed on May 7, 2002, now Pat. No. 6,693,939, which is a continuation-in-part of application No. 10/036,676, filed on Dec. 21, 2001, now Pat. No. 6,882,674, which is a continuation-in-part of application No. 10/036,727, filed on Dec. 21, 2001, now Pat. No. 6,865,210, which is a continuation-in-part of application No. 10/006,913, filed on Nov. 29, 2001, now Pat. No. 6,535,531, which is a continuation-in-part of application No. 10/000,991, filed on Nov. 14, 2001, now Pat. No. 6,795,474, which is a continuation-in-part of application No. 09/943,343, filed on Aug. 29, 2001, now Pat. No. 6,567,450, which is a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/837,035, filed on Apr. 18, 2001, now Pat. No. 6,618,421, which is a continuation-in-part of application No. 09/829,475, filed on Apr. 9, 2001, now Pat. No. 6,765,945.

(51) Int. Cl.
*H01S 3/22* (2006.01)

(52) U.S. Cl. ..... 372/58; 372/55; 372/57; 372/25

(58) Field of Classification Search ..... 372/55, 372/57, 58
See application file for complete search history.

(56) References Cited

U.S. PATENT DOCUMENTS 4,223,279 A 9/1980 Bradford, Jr. et al. ..... 331/94.5
(Continued)

OTHER PUBLICATIONS

U.S. Appl. No. 09/608,543, Fomenkov et al., filed Jun. 30, 2000.
(Continued)

*Primary Examiner* — Dung T Nguyen

(57) ABSTRACT

The present invention provides a control system for a modular high repetition rate two discharge chamber ultraviolet gas discharge laser. In preferred embodiments, the laser is a production line machine with a master oscillator producing a very narrow band seed beam which is amplified in the second discharge chamber. Feedback timing control techniques are provided for controlling the relative timing of the discharges in the two chambers with an accuracy in the range of about 2 to 5 billionths of a second even in burst mode operation. This MOPA system is capable of output pulse energies approximately double the comparable single chamber laser system with greatly improved beam quality.

38 Claims, 30 Drawing Sheets

U.S. PATENT DOCUMENTS

| | | | | |
|---|---|---|---|---|
| 4,455,658 | A | 6/1984 | Sutter, Jr. | 372/38 |
| 4,959,840 | A | 9/1990 | Akins et al. | 372/57 |
| 5,023,884 | A | 6/1991 | Akins et al. | 372/57 |
| 5,025,445 | A | 6/1991 | Anderson et al. | 372/20 |
| 5,025,446 | A | 6/1991 | Kuizenga | 372/21 |
| 5,189,678 | A | 2/1993 | Ball et al. | 372/28 |
| 5,313,481 | A | 5/1994 | Cook et al. | 372/37 |
| 5,315,611 | A | 5/1994 | Ball et al. | 372/56 |
| 5,359,620 | A | 10/1994 | Akins | 372/58 |
| 5,448,580 | A | 9/1995 | Birx et al. | 372/38 |
| 5,471,965 | A | 12/1995 | Kapich | 123/565 |
| 5,852,621 | A | 12/1998 | Sandstrom | 372/25 |
| 5,863,017 | A | 1/1999 | Larson et al. | 248/176.1 |
| 5,953,360 | A | 9/1999 | Vitruk et al. | 372/87 |
| 5,978,394 | A | 11/1999 | Newman et al. | 372/32 |
| 6,005,879 | A | 12/1999 | Sandstrom et al. | 372/25 |
| 6,016,325 | A | 1/2000 | Ness et al. | 372/38 |
| 6,018,537 | A | 1/2000 | Hofmann et al. | 372/25 |
| 6,028,880 | A | 2/2000 | Carlesi et al. | 372/58 |
| 6,067,311 | A | 5/2000 | Morton et al. | 372/57 |
| 6,094,448 | A | 7/2000 | Fomenkov et al. | 372/102 |
| 6,104,735 | A | 8/2000 | Webb | 372/37 |
| 6,128,323 | A | 10/2000 | Myers et al. | 372/38 |
| 6,151,349 | A | 11/2000 | Gong et al. | 372/58 |
| 6,164,116 | A | 12/2000 | Rice et al. | 73/1.72 |
| 6,192,064 | B1 | 2/2001 | Algots et al. | 372/99 |
| 6,208,674 | B1 | 3/2001 | Webb et al. | 372/57 |
| 6,208,675 | B1 | 3/2001 | Webb | 372/58 |
| 6,219,368 | B1 | 4/2001 | Govorkov | 372/59 |
| 6,240,117 | B1 | 5/2001 | Gong et al. | 372/58 |
| 6,330,261 | B1 | 12/2001 | Ishihara et al. | 372/38.1 |
| 6,414,979 | B2 | 7/2002 | Ujazdowski et al. | 372/87 |
| 6,477,193 | B2 | 11/2002 | Oliver et al. | 372/58 |
| 6,532,247 | B2 | 3/2003 | Spangler et al. | 372/61 |
| 6,538,737 | B2 | 3/2003 | Sandstrom et al. | 356/334 |
| 6,567,163 | B1 | 5/2003 | Sandstrom | 356/317 |
| 6,567,450 | B2 | 5/2003 | Myers et al. | 372/55 |
| 6,625,191 | B2 | 9/2003 | Knowles et al. | 372/55 |
| 6,671,294 | B2 | 12/2003 | Kroyan et al. | 372/20 |
| 6,693,939 | B2 | 2/2004 | Klene et al. | 372/25 |
| 6,704,339 | B2 | 3/2004 | Lublin et al. | 372/55 |
| 6,704,340 | B2 | 3/2004 | Ershov et al. | 372/55 |
| 6,721,340 | B1 | 4/2004 | Fomenkov et al. | |
| 6,750,972 | B2 | 6/2004 | Sandstrom et al. | |
| 2002/0006149 | A1 | 1/2002 | Spangler et al. | 372/61 |
| 2002/0048288 | A1 | 4/2002 | Kroyan et al. | 372/20 |
| 2002/0101589 | A1 | 8/2002 | Sandstrom et al. | 356/334 |
| 2002/0154668 | A1* | 10/2002 | Knowles et al. | 372/55 |
| 2002/0191654 | A1* | 12/2002 | Klene et al. | 372/55 |
| 2003/0043876 | A1* | 3/2003 | Lublin et al. | 372/55 |
| 2003/0091087 | A1* | 5/2003 | Ershov et al. | 372/55 |

OTHER PUBLICATIONS

U.S. Appl. No. 10/173,190, Sandstrom et al., filed Jun. 14, 2002.

* cited by examiner

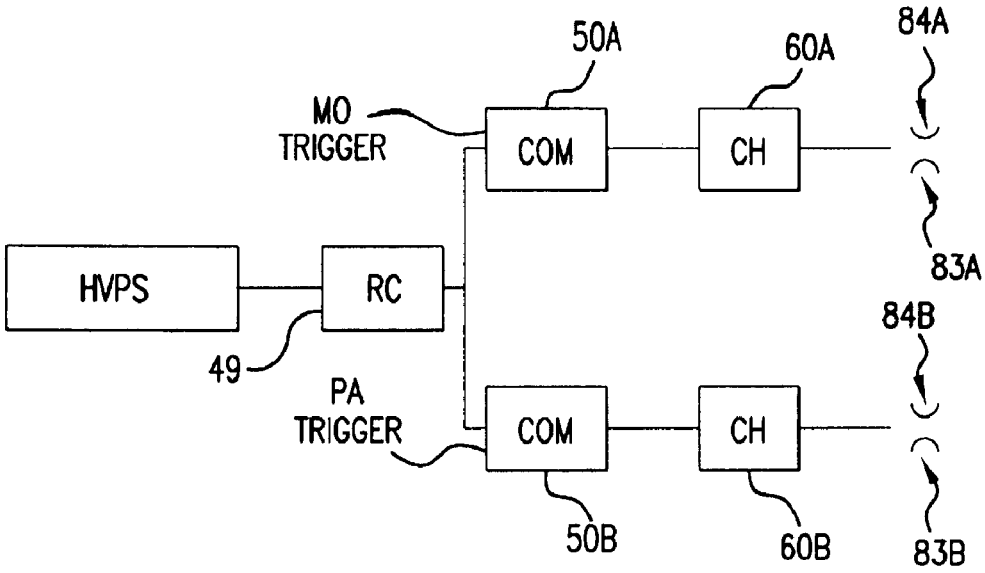
FIG.5C1
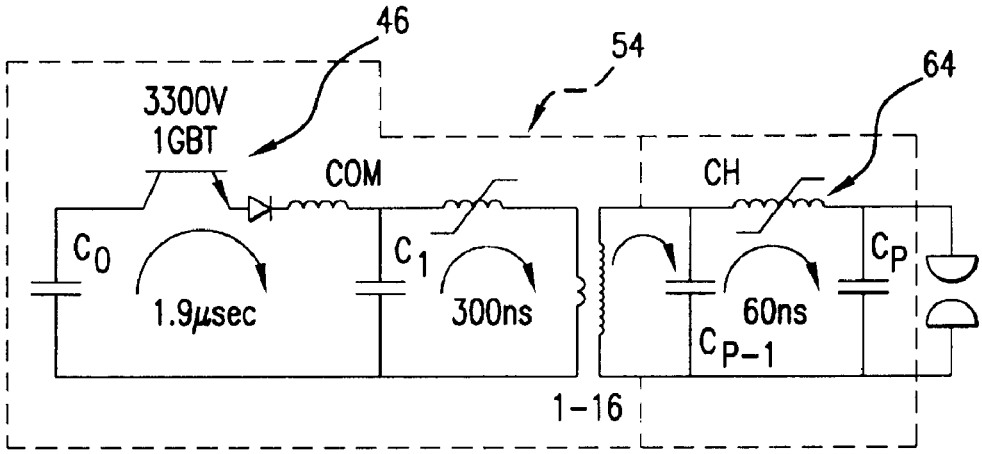
FIG.5C2
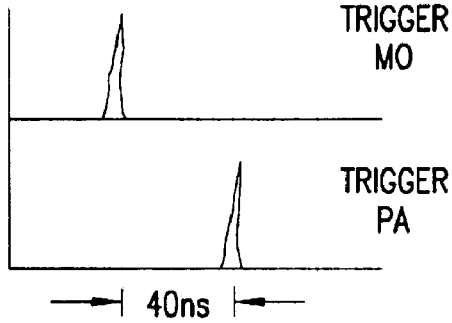
FIG.5C3

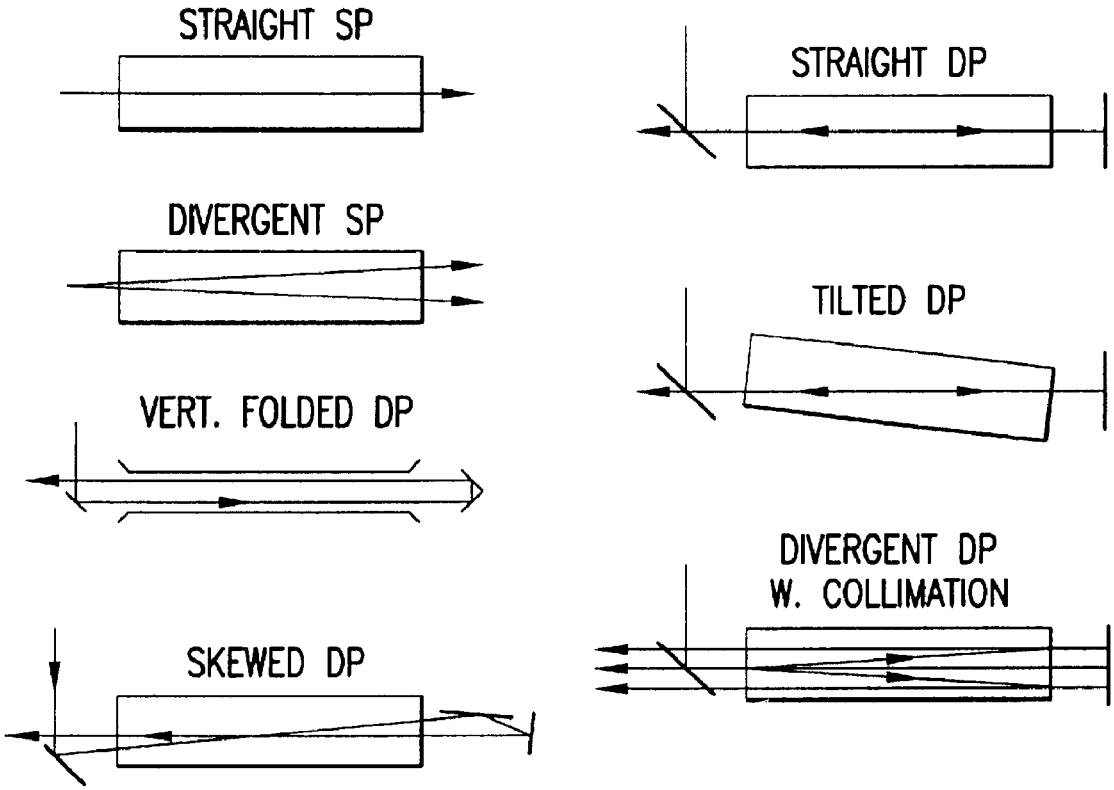
FIG.6A1

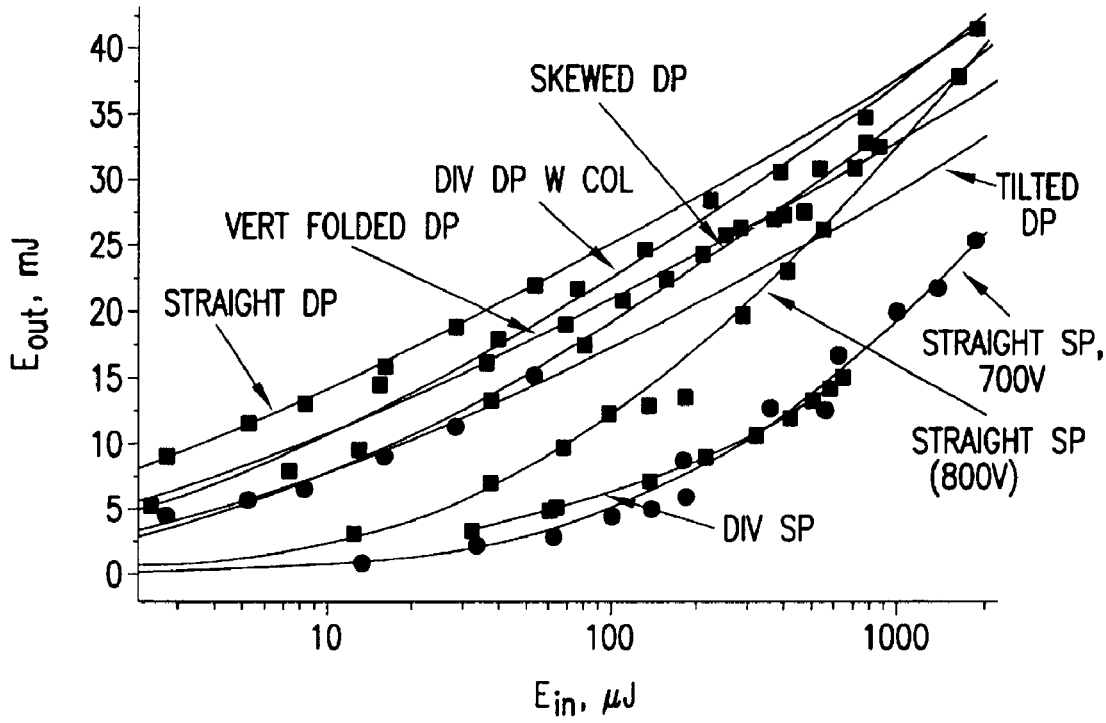
FIG.6A2

CONTROL SYSTEM FOR A TWO CHAMBER GAS DISCHARGE LASER SYSTEM

Matter enclosed in heavy brackets [ ] appears in the original patent but forms no part of this reissue specification; matter printed in italics indicates the additions made by reissue.

The present invention is a continuation-in-part of Ser. No. 10/187,336 filed Jun. 28, 2002 *now U.S. Pat. No. 6,914,919*, of Ser. No. 10/141,216 filed May 7, 2002, *now U.S. Pat. No. 6,693,939* of Ser. No. 10/036,676, filed Dec. 21, 2001, *now U.S. Pat. No. 6,882,674* Ser. No. 10/036,727 filed Dec. 21, 2001, *now U.S. Pat. No. 6,865,210* Ser. No. 10/006,913 filed Nov. 29, 2001, *now U.S. Pat. No. 6,535,531* Ser. No. 10/000,991 filed Nov. 14, 2001, *now U.S. Pat. No. 6,795,474* Ser. No. 09/943,343, filed Aug. 29, 2001, *now U.S. Pat. No. 6,567,450* Ser. No. 09/854,097, filed May 11, 2001, *now U.S. Pat. No. 6,757,316* Ser. No. 09/848,043, filed May 3, 2001, *now U.S. Pat. No. 6,549,551* Ser. No. 09/837,035 filed Apr. 18, 2001 *now U.S. Pat. No. 6,618,421* and Ser. No. 09/829,475 filed Apr. 9, 2001, *now U.S. Pat. No. 6,765,945* all of which are incorporated herein by reference. This invention relates to lithography light sources for integrated circuit manufacture and especially to gas discharge laser lithography light sources for integrated circuit manufacture.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP" for KrF and ArF lasers) which forms the back of the laser's resonant cavity (A line selection unit "LSU" is used for selecting a narrow spectral band in the $F_2$ laser.) The LNP is comprised of delicate optical elements including prisms, a mirror and a grating. Electric discharge gas lasers of the type described in Patent '884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances In Lithography Light Sources

Excimer lasers such as described in the '884 patent have during the period 1989 to 2001 become the primary light source for integrated circuit lithography. More than 1000 of these lasers are currently in use in the most modem integrated circuit fabrication plants. Almost all of these lasers have the basic design features described in the '884 patent. This is:

(1) a single, pulse power system for providing electrical pulses across the electrodes at pulse rates of about 100 to 2500 pulses per second;

(2) a single resonant cavity comprised of a partially reflecting mirror-type output coupler and a line narrowing unit consisting of a prism beam expander, a tuning mirror and a grating;

(3) a single discharge chamber containing a laser gas (either krypton, fluorine and neon for KrF lasers or argon, fluorine and neon for ArF lasers), two elongated electrodes and a tangential fan for circulating the laser gas between the two electrodes fast enough to clear the discharge region between pulses of debris from the previous pulse, and (4) a beam monitor for monitoring pulse energy, wavelength and bandwidth of output pulses with a feedback control system for controlling pulse energy, energy dose and wavelength on a pulse-to-pulse basis.

During the 1989-2001 period, output power of these lasers has increased gradually and beam quality specifications for pulse energy stability, wavelength stability and bandwidth have become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm full width half maximum (FWHM) and pulse energy stability at +/−0.35%.

Control of Pulse Energy and Dose Energy

When these gas discharge are used as light sources for integrated circuit fabrication they are usually operated in what is known as "burst mode" operation. For example, a laser may be operated at a repetition rate of 2,500 Hz for 0.3 seconds with pulse energies of about 8 mJ in order to scan a die spot on a silicon wafer. The laser is then "off" for a period of about 0.3 seconds while the scanner positions the wafer and the scanner optics for illumination of the next die spot. This routine continues until all of the die spots on the wafer (for example, 200 die spots) have been illuminated. Then the scanner equipment replaces the scanned wafer with another wafer. Thus, the typical laser operating cycle would be:

(1) on 0.3 second
(2) off 0.3 second
(3) repeat steps (1) and (2) 200 times
(4) off 10 seconds
(5) repeat steps (1)-(4) continuously.

This type of operation may be continuous 24 hours per day, 7 days per week with short down times for maintenance or other events.

It is very important that each die spot receive the desired quantity of laser illumination and that the illumination be applied uniformly. Therefore the common practice is to monitor and control the pulse energy of each and every pulse to within a few percent (typically about 6 percent) of a target value (for example, 8 mJ±0.5 mJ). Since there are these variations in the pulse to pulse energies, a common practice is to monitor the accumulated energy (referred to as dose energy) in a series of pulses (such as moving window of 30 pulses). These control techniques require the monitoring of the pulse energy for every pulse, utilization of information thus obtained to calculate control parameters for subsequent pulses and the adjustment discharge voltages on a pulse to pulse basis so that both pulse energy and dose are maintained within desired ranges.

Monitoring and Control of Wavelength and Bandwidth

Modem integrated circuit fabrication requires the printing of circuits with precise dimensions with accuracies in the range of about 0.5 to 0.25 micron or less. This requires very precise focusing of the light from the lithography light sources through projection optics of the stepper machines. Such precise focusing requires control of the center wavelength and bandwidth of the light source. Therefore, the wavelengths and bandwidth of the laser beam from there laser are typically monitored for each pulse and to assure that they remain within desired target ranges. Typically, the wavelength is controlled using a feedback control based on the monitored values of center wavelength. This feedback signal is used to position the pivoting mirror in the LNP described above to change the direction at which laser light is reflected from defraction grating also in the LNP. The centerline wavelength is monitored on a pulse-to-pulse basis and the wavelength is feedback controlled on as close to a pulse-to-pulse basis as feasible. The response time for center wavelength control of prior art lithographic lasers has been a few milliseconds. Bandwidth is monitored on a pulse-to-pulse basis. Bandwidth can be affected by $F_2$ concentration and gas pressure; so these parameters are controlled to help assure that bandwidth values remain within desired ranges. Prior art lithography lasers typically do not provide for fast response control of bandwidth.

Injection Seeding

A well-known technique for reducing the bandwidth of gas discharge laser systems (including excimer laser systems) involves the injection of a narrow band "seed" beam into a gain medium. In some of these systems a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems has been limited.

What is needed is a better control system for a pulse gas discharge laser for operation at repetition rates in the range of about 4,000 to 6,000 pulses per second or greater.

SUMMARY OF THE INVENTION

The present invention provides a control system for a modular high repetition rate two discharge chamber ultraviolet gas discharge laser. In preferred embodiments, the laser is a production line machine with a master oscillator producing a very narrow band seed beam which is amplified in the second discharge chamber. Feedback timing control techniques are provided for controlling the relative timing of the discharges in the two chambers with an accuracy in the range of about 2 to 5 billionths of a second even in burst mode operation. This MOPA system is capable of output pulse energies approximately double the comparable single chamber laser system with greatly improved beam quality.

In preferred embodiments a single very fast response resonant charger charges in parallel (in less than 250 microseconds) separate charging capacitors for the master oscillator (MO) and the power amplifier (PA). Preferably the charger includes a De-Queuing circuit and a bleed down circuit for precise control of charging voltage. In this embodiment a fast response trigger timing module provides a trigger signal and monitors light-out signals with better than nanosecond precision. In a preferred embodiment a control processor is programmed with an algorithm for generating small charging voltage dithers to produce feedback responses from which trigger timing can be controlled to maintain laser operation within desired ranges of laser efficiency and/or beam quality. In preferred embodiments the system may be operated as a KrF, an ArF or as an $F_2$ laser system. Pulse power components are preferably water cooled to minimize heating effects. The MO may be operated at a reduced gas pressure or lower $F_2$ concentration as compared to the PA for narrower bandwidth. Also, the MO beam is apertured significantly to improve beam spectral quality. Trigger timing techniques are also disclosed to produce improvements in beam quality. In addition, an improved line narrowing module also contributes to better beam spectral quality. In a described preferred embodiment, the laser system includes a control area network (CAN) with three CAN clusters providing two-way communication from a laser control platform to various laser modules. Preferred embodiment of the laser system also include a pulse stretcher for increasing the length of laser pulses and a beam delivery unit with control over beam alignment.

BRIEF DESCRIPTION OF THE DRAWINGS

FIGS. 5C1, 5C2 and 5C3 show features of a MOPA trigger control technique.

FIGS. 6A1 and 6A2 show various power amplifier configurations and results.

FIG. 6F1 shows the time delay graphically.

DETAILED DESCRIPTION OF PREFERRED EMBODIMENTS

MOPA LASER LITHOGRAPHY LIGHT SOURCE

General Description

Figure 1:
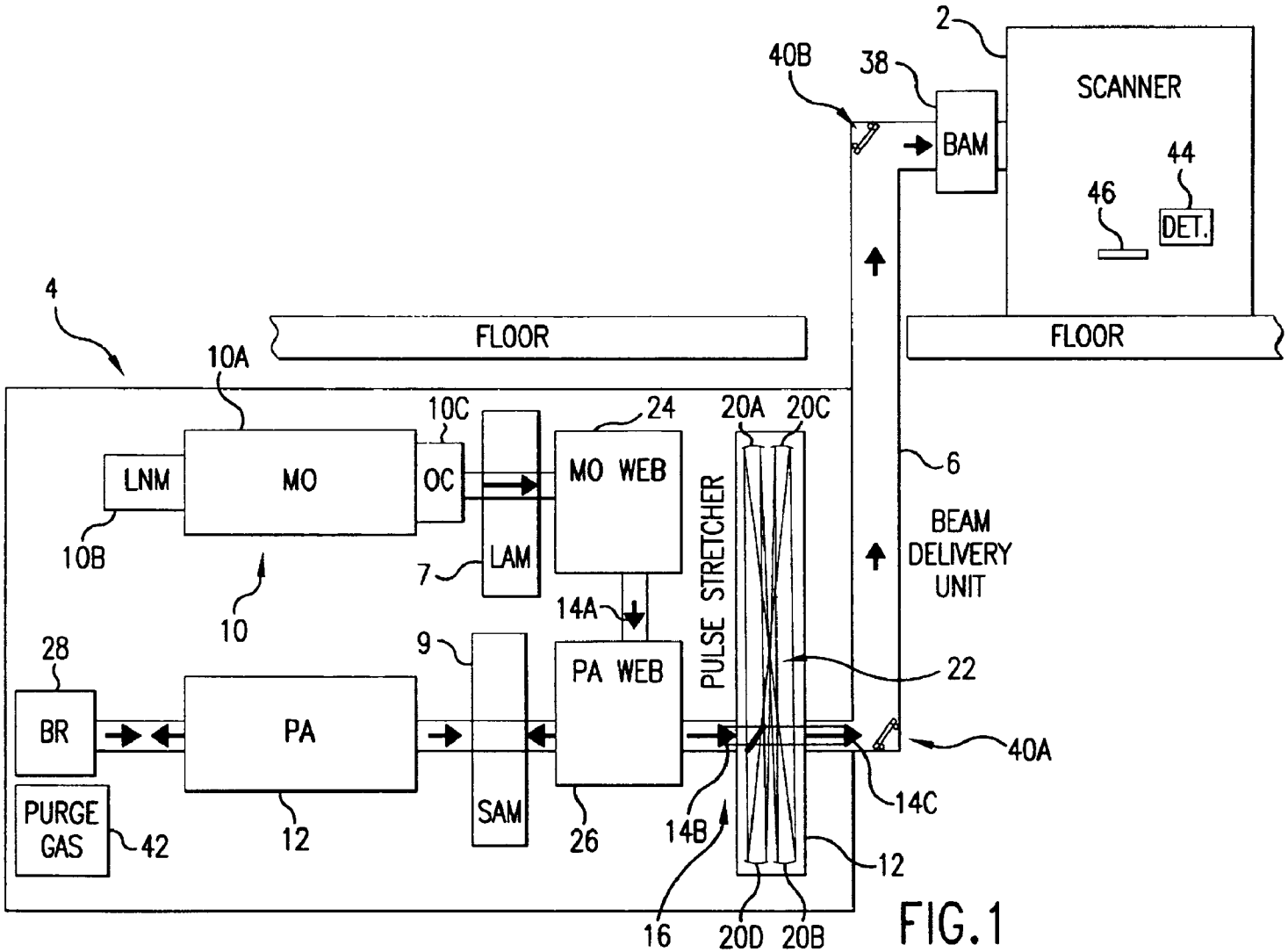
FIG. 1 is a block diagram of a MOPA Laser System.

A laser system incorporating a first preferred embodiment of the present invention is shown in FIG. 1. In this embodiment a 193 nm ultraviolet laser beam is provided at the input port of a lithography machine 2 such as stepper or scanner machines supplied by Canon or Nikon with facilities in Japan or ASML with facilities in the Netherlands. This laser system includes a laser energy control system for controlling both pulse energy and accumulated dose energy output of the system at pulse repetition rates of 4,000 Hz or greater. The system provides extremely accurate triggering of the discharges in the two laser chambers relative to each other with both feedback and feed-forward control of the pulse and dose energy.

In this case the main components of the laser system 4 are installed below the deck on which the scanner is installed. However, this laser system includes a beam delivery unit 6, which provides an enclosed beam path for delivering the laser beam to the input port of scanner 2. This particular light source system includes a master oscillator 10 and a power amplifier 12 and is a type of laser system known as MOPA system. The light source also includes a pulse stretcher. This light source represents an important advancement in integrated circuit light sources over the prior art technique of using a single laser oscillator to provide the laser light.

Figures 1A, 1B:
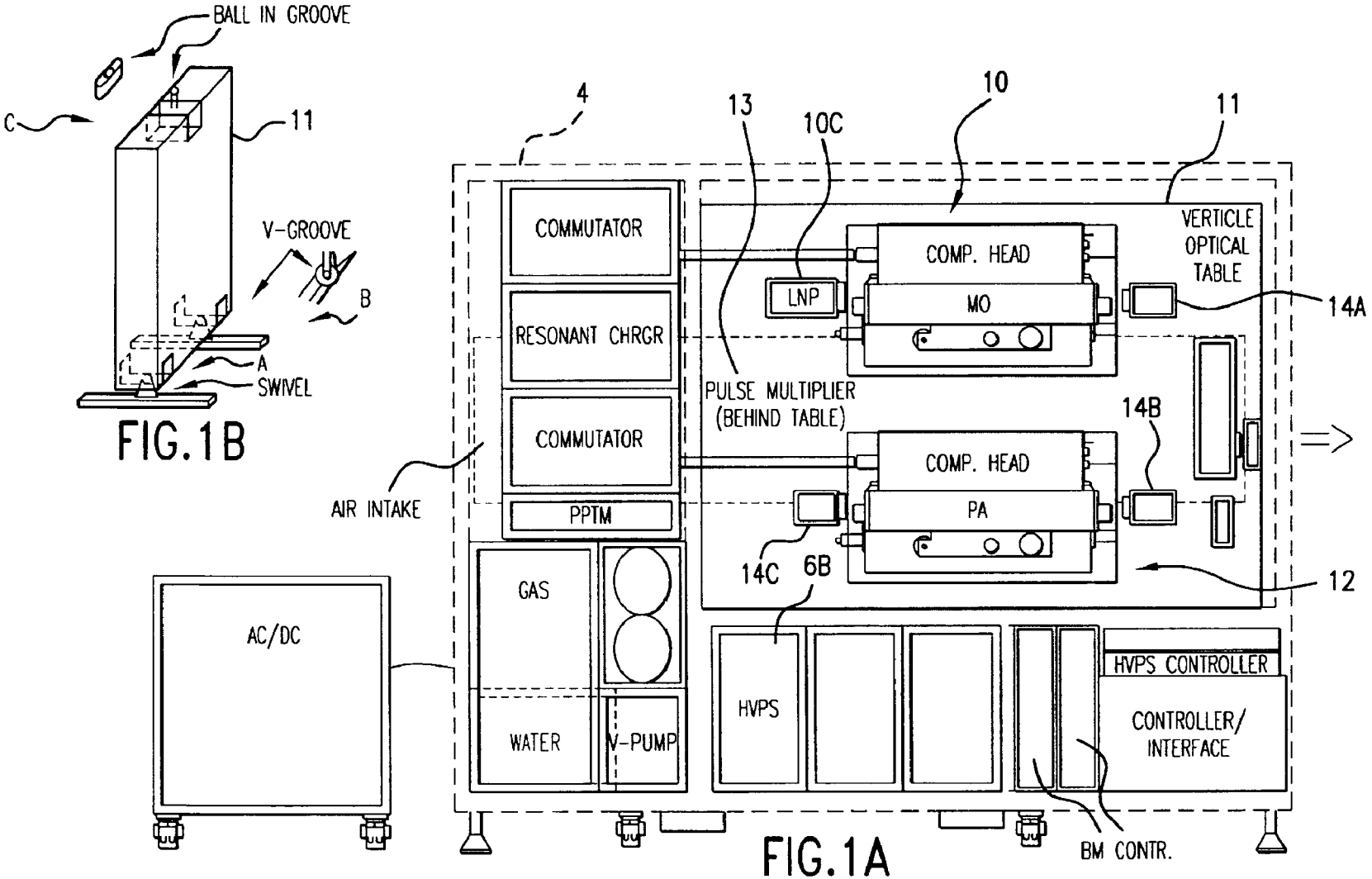
FIG. 1A is a cutaway drawing of the FIG. 1 System.
FIG. 1B is a drawing showing a mounting technique for laser components.

The master oscillator and the power amplifier each comprise a discharge chamber similar to the discharge chamber of prior art single chamber lithography laser systems. These chambers (described in detail below) contain two elongated electrodes, a laser gas, a tangential for circulating the gas between the electrodes and water-cooled finned heat exchangers. The master oscillator produces a first laser beam 14A which is amplified by two passes through the power amplifier to produce laser beam 14B as shown in FIG. 1. The master oscillator 10 comprises a resonant cavity formed by output coupler 10C and line narrowing package 10B both of which are described generally in the background section and in more detail below in the referenced patents and parent applications. The gain medium for master oscillator 10 is produced between two 50-cm long electrodes contained within master oscillator discharge chamber 10A. Power amplifier 12 is basically a discharge chamber and in this preferred embodiment is almost exactly the same as the master oscillator discharge chamber 10A providing a gain medium between two elongated electrodes but power amplifier 12 has no resonant cavity. This MOPA configuration permits the master oscillator to be designed and operated to maximize beam quality parameters such as wavelength stability and very narrow bandwidth; whereas the power amplifier is designed and operated to maximize power output. For example, the current state of the art light source available from Cymer, Inc. (Applicants' employer) is a single chamber 5 mJ per pulse, 4 kHz, ArF laser system. The system shown in FIG. 1 is a 10 mJ per pulse (or more, if desired) 4 kHz ArF laser system producing at least twice the average ultraviolet power with substantial improvement in beam quality. For this reason the MOPA system represents a much higher quality and much higher power laser light source. FIG. 1A shows the general location of the above referred to components in one version of the MOPA modular laser system.

The Master Oscillator

Figure 3:
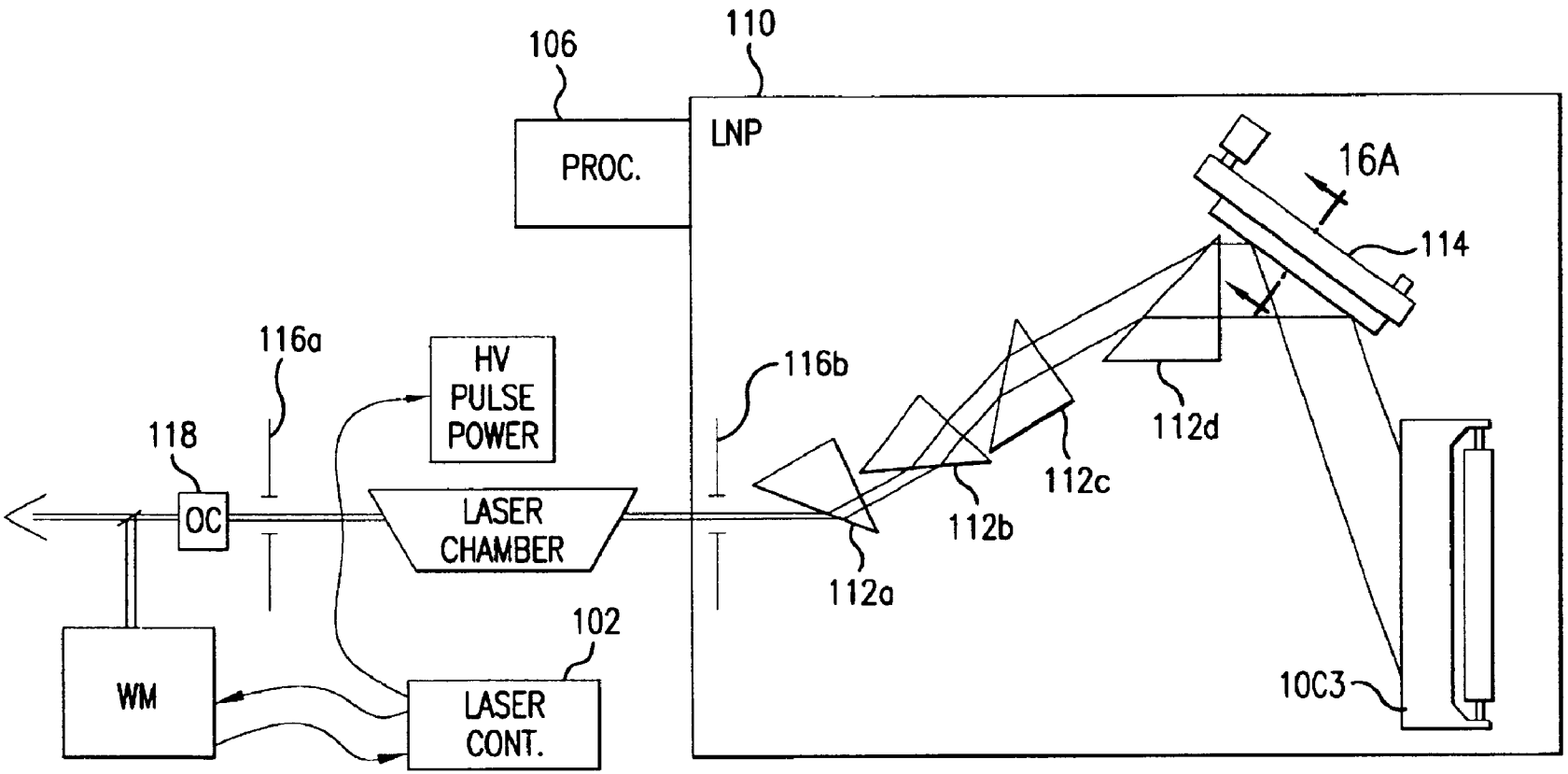
FIG. 3 is a schematic drawing showing features of a narrow band laser oscillator.
Figure 3A:
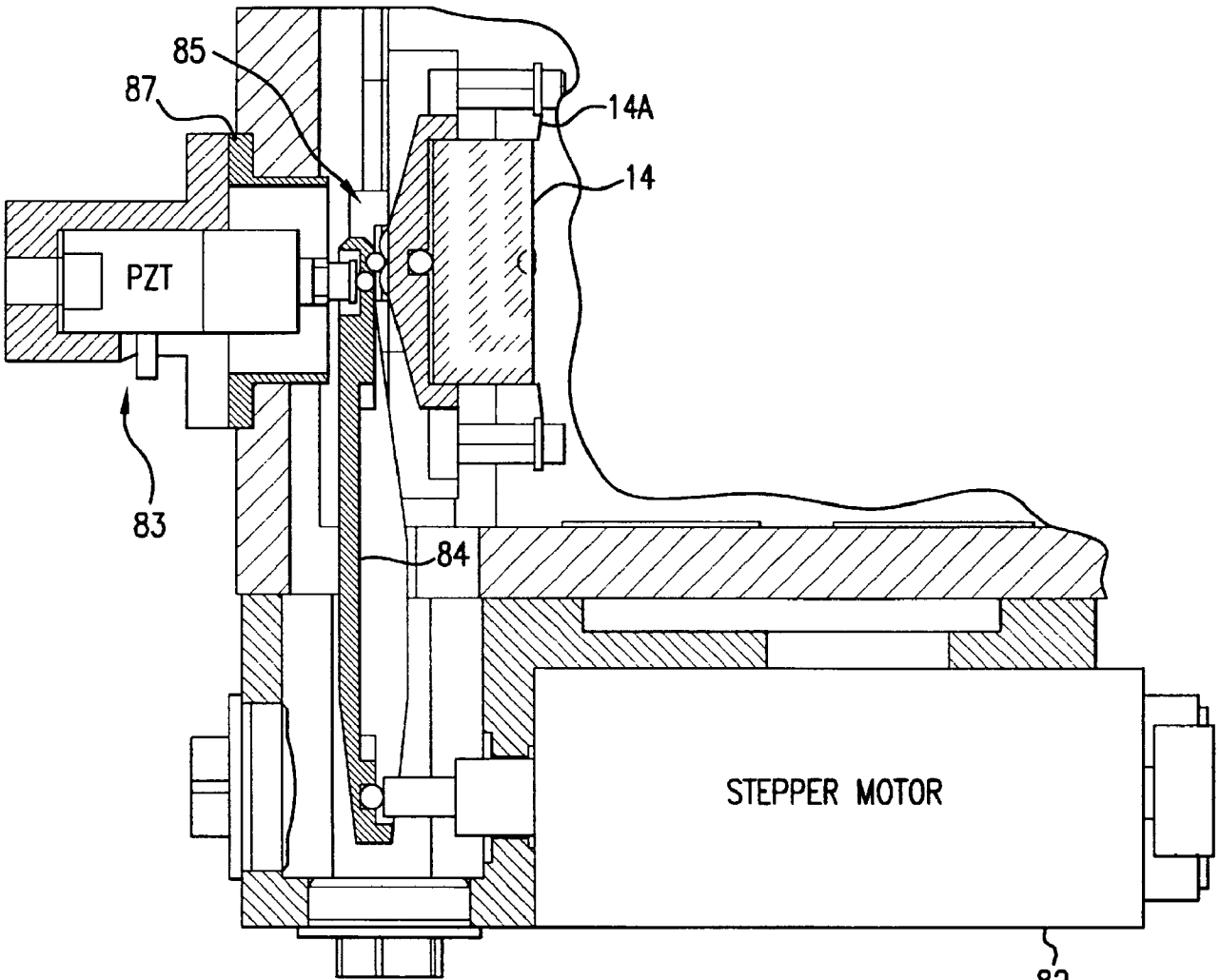
FIG. 3A is a drawing showing control features of a line narrowing unit.

The master oscillator 10 shown in FIGS. 1 and 1A is in many ways similar to prior art ArF lasers such as described in the '884 patent and in U.S. Pat. No. 6,128,323 and has many of the features of the ArF laser described in U.S. patent application Ser. No. 09/854,097 except the output pulse energy is typically about 0.1 mJ instead of about 5 mJ. As described in great detail in the '097 application, major improvements over the '323 laser are provided to permit operation at 4000 Hz and greater. The master oscillator of the present invention is optimized for spectral performance including precise wavelengths and bandwidth control. This result is a much more narrow bandwidth and improved wavelength stability and bandwidth stability. The master oscillator comprises discharge chamber 10A as shown in FIG. 1, FIG. 1A, and FIG. 2 in which are located a pair of elongated electrodes 110A2 and 110A4, each about 50 cm long and spaced apart by about 0.5 inch. Anode 10A4 is mounted on flow shaping anode support bar 10A6. Four separate finned water-cooled heat exchanger units 10A8 are provided. A tangential fan 10A10 is driven by two motors (not shown) for providing a laser gas flow at velocities of up to about 80 m/s between the electrodes. The chamber includes window units (not shown) with $CaF_2$ windows positioned at about 45° with the laser beam. An electrostatic filter unit having an intake at the center of the chamber, filters a small portion of the gas flow as indicated at 11 in FIG. 2 and the cleaned gas is directed into each of the window units in the manner described in U.S. Pat. No. 5,359,620 (incorporated herein by reference) to keep discharge debris away from the windows. The gain region of the master oscillator is created by discharges between the electrodes through the laser gas which in this embodiment is comprised of about 3% argon, 0.1% $F_2$ and the rest neon. The gas flow clears the debris of each discharge from the discharge region prior to the next pulse. The resonant cavity is created at the output side of the oscillator by an output coupler 10C (as shown in FIG. 1) which is comprised of a $CaF_2$ mirror mounted perpendicular to the beam direction and coated to reflect about 30% of light at 193 nm and to pass about 70% of the 193 nm light. The opposite boundary of the resonant cavity is a line narrowing unit 10B as shown in FIG. 1 similar to prior art line narrowing units described in U.S. Pat. No. 6,128,323. Important improvements in this line narrowing package as shown in FIG. 3 include four CaF beam expanding prisms 112a-d for expanding the beam in the horizontal direction by 45 times and a tuning mirror 114 controlled by a stepper motor for relatively large pivots and a piezoelectric driver for providing extremely fine tuning of the center line wavelength. FIG. 3A shows the stepper motor 82 and piezoelectric driver 83. The stepper motor provides its force to mirror 114 through lever arm 84 and piezoelectric driver 83 applies its force on the fulcrum 85 of the lever system. An LNP processor 89 located at the LNP controls both the stepper motor and the piezoelectric driver based on feedback instructions from a line center analysis module (LAM) 7. Echelle grating 10C3 having about 80 facets per mm is mounted in the Litrow configuration and reflects a very narrow band of UV light selected from the approximately 300 pm wide ArF natural spectrum. This line narrowing unit is preferably purged continuously during operation with helium. (Nitrogen is another alternate purge gas.) Preferably the master oscillator is operated at a much lower $F_2$ concentration than is typically used in prior art lithography light sources. This results in substantial reductions in the bandwidth since Applicants have shown that bandwidth decreases substantively with decreasing $F_2$ concentrations. Another important improvement is a narrow rear aperture which limits the cross section of the oscillator beam to 1.1 mm in the horizontal direction and 7 mm in the vertical direction. Control of the oscillator beam is discussed below.

In preferred embodiments the main charging capacitor banks for both the master oscillator and the power amplifier are charged in parallel so as to reduce jitter problems. This is desirable because the times for pulse compression in the pulse compression circuits of each of the two pulse power systems is very dependent on the level of the charge of the charging capacitors. Preferably pulse energy output is controlled on a pulse-to-pulse basis by adjustment of the charging voltage. This limits the use of voltage to control beam parameters of the master oscillator. However, laser gas pressure and $F_2$ concentration can be easily controlled separately in each of the two chambers to achieve desirable beam parameters over a wide range of pulse energy levels and laser gas pressures. Bandwidth decreases with decreasing $F_2$ concentration and laser gas pressure. These control features are in addition to the LNP controls which are discussed in detail below.

Power Amplifier

The power amplifier in this preferred embodiment is comprised of a laser chamber which, with its internal components, as stated above is very similar to the corresponding master oscillator discharge chamber. Having the two separate chambers allows the pulse energy and dose energy (i.e., integrated energy in a series of pulses) to be controlled, to a large extent, separately from wavelength and bandwidth. This permits higher power and better dose stability. All of the components of the chamber are the same and are interchangeable during the manufacturing process. However, in operation, the gas pressure can be substantially higher in the PA as compared to the MO. Laser efficiency increases with $F_2$ concentration and laser gas pressure over a wide range of $F_2$ concentration; however lower $F_2$ concentrations can result in smaller bandwidths. The compression head 12B of the power amplifier is also substantially identical in this embodiment to the 10B compression head of the MO and the components of the compression heads are also interchangeable during manufacture. This close identity of the chambers and the electrical components of the pulse power systems helps assure that the timing characteristics of the pulse forming circuits are the same or substantially the same so that jitter problems are minimized. One minor difference is that the capacitors of the MO compression head capacitor bank are more widely positioned to produce a substantially higher inductance as compared to the PA.

The power amplifier is configured for two beam passages through the discharge region of the power amplifier discharge chamber as shown in FIG. 1. The beam oscillates several times through the chamber 10A between LNP 10B and output coupler 10C (with 30 percent reflectance) of the MO 10 as shown in FIG. 1 and is severely line narrowed on its passages through LNP 10C. The line narrowed seed beam is reflected downward by a mirror in the MO wavelength engineering box (MO WEB) 24 and reflected horizontally at an angle slightly skewed (with respect to the electrodes orientation) through chamber 12. At the hack end of the power amplifier beam reverser 28 reflects the beam back for a second pass through PA chamber 12 horizontally in line with the electrodes orientation.

The charging voltages preferably are selected on a pulse-to-pulse basis to maintain desired pulse and dose energies. $F_2$ concentration and laser gas pressure can be adjusted to provide a desired operating range of charging voltage (since as stated above charging voltage decreases with increasing $F_2$ concentration and gas pressure for a given output pulse energy). This desired range can be selected to produce a desired value of dE/dV since the change in energy with voltage is also a function of $F_2$ concentration and laser gas pressure. F2 gas is depleted in the chambers over time and their depletion is in general accommodated by a corresponding increase in charging voltage to maintain desired pulse energy. The timing of injections is preferable based on charging voltage. The frequency of injections preferably is kept high (and the inserted quantity is preferably kept small) to keep conditions relatively constant and injections can be continuous or nearly continuous. However, some users of these laser systems may prefer larger durations (such as 2 hours) between $F_2$ injections. Some users may prefer that the laser be programmed to not fire during $F_2$ injections.

MOPA Control System

Figures 1, 1C:
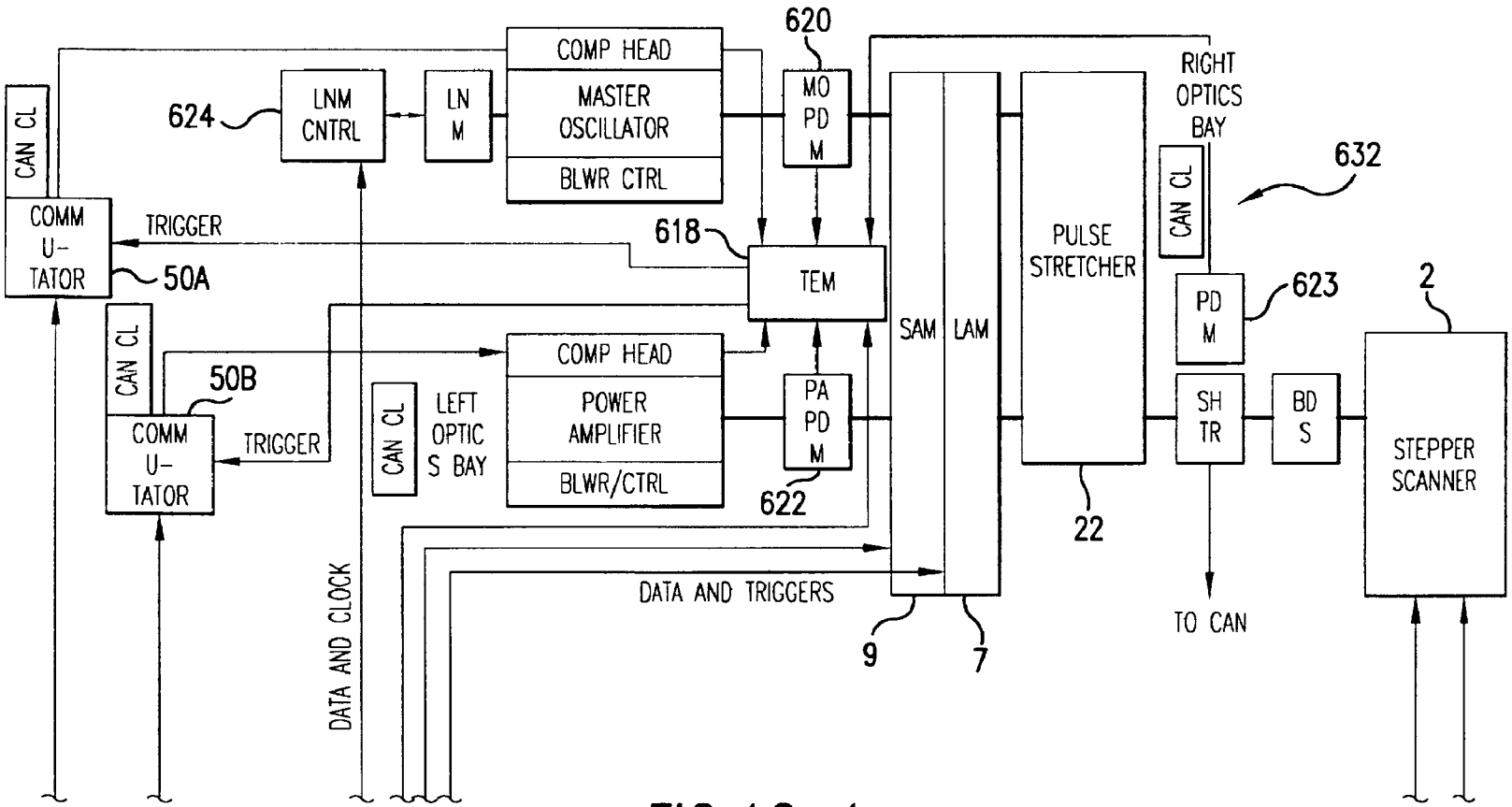
FIG. 1C is a block diagram showing a MOPA control system.
Figures 1, 1C, 2:
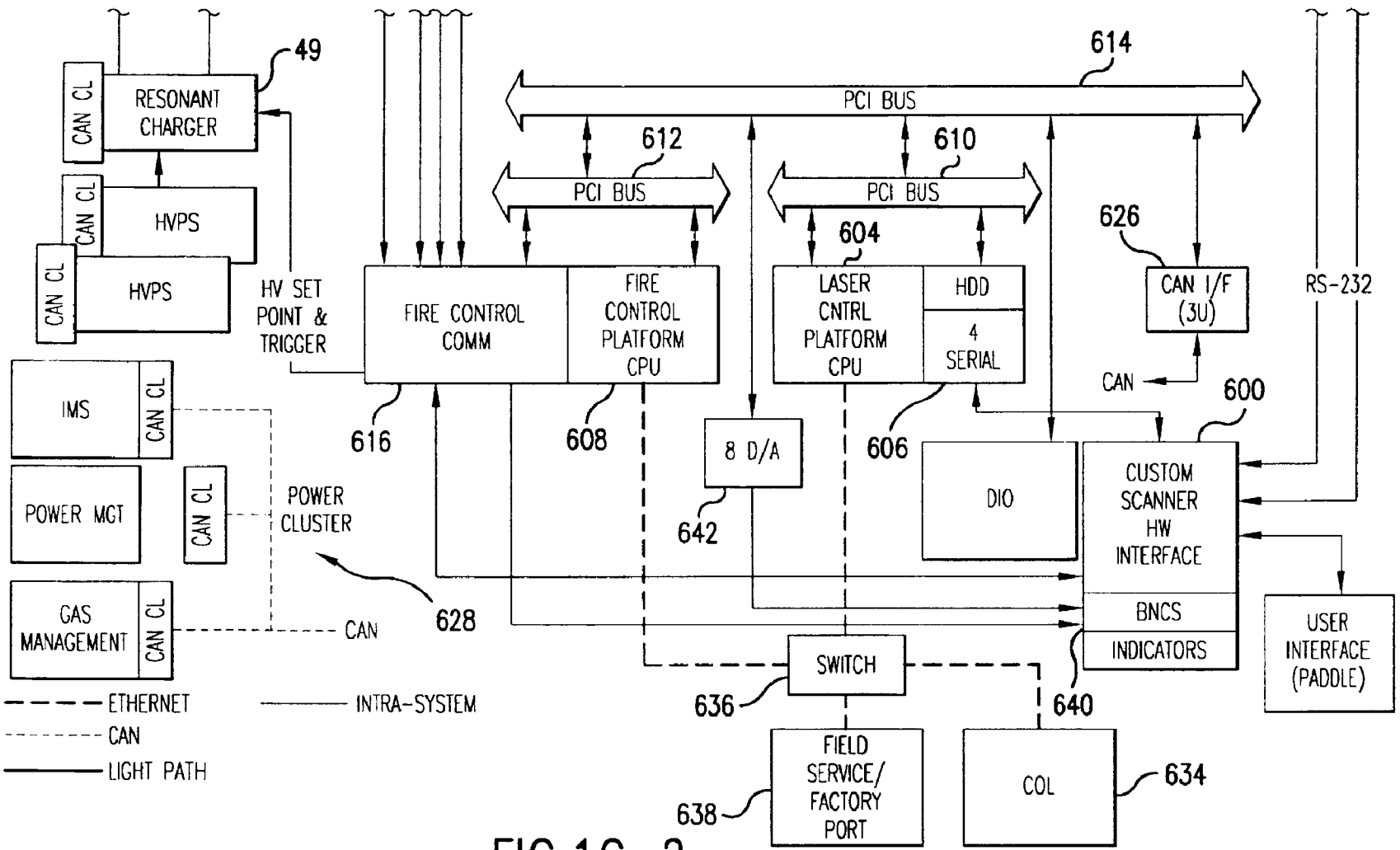
FIG. 2 is a cross-section drawing of a laser chamber.

FIG. 1C is a block diagram showing many of the important control features of a preferred embodiment of the present invention. The control system includes RS232 laser-scanner interface hardware 600 which comprises special software permitting laser control from any of several types of lithography machines 2 (which could be a stepper or scanner machine) or a laser operation control paddle 602. Central processing unit 604 is the master control for the MOPA system and receives instructions through four serial ports 606 and interface hardware 600, from lithography machine 2 and operator control paddle 602.

Figure 1D:
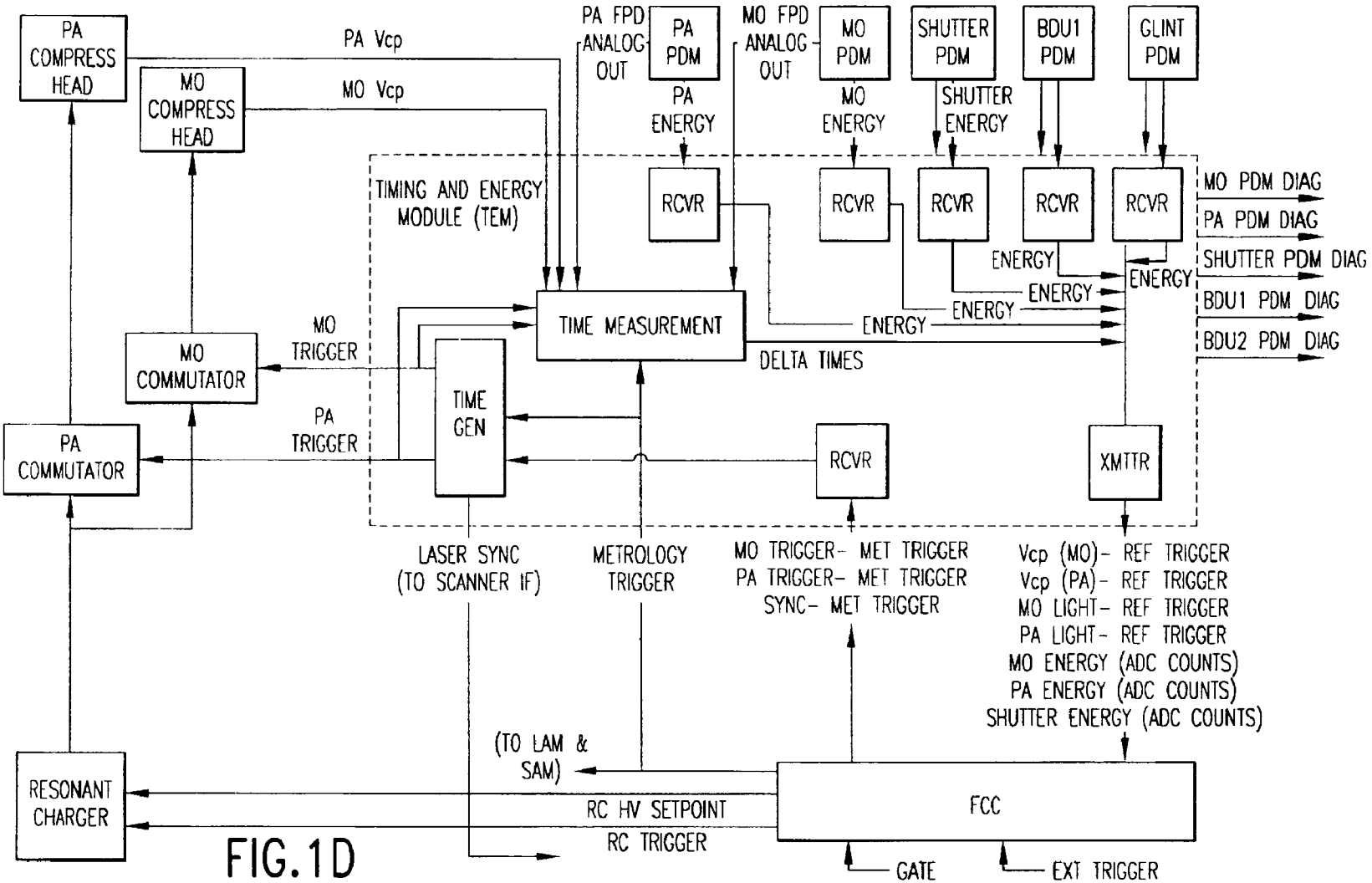
FIG. 1D is a block diagram of a portion of the control system.
Figure 2:
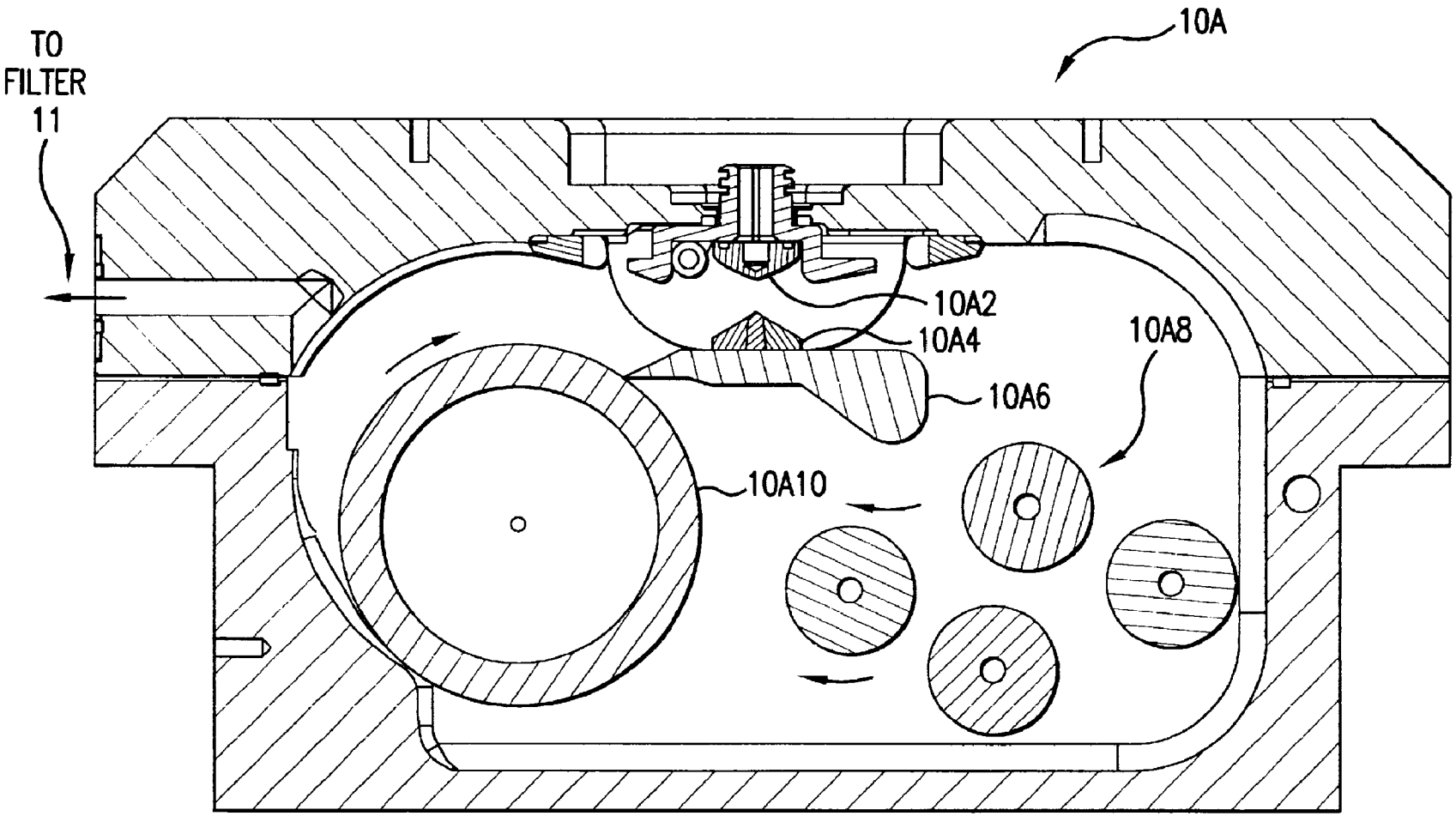

Laser control CPU 604 communicates to fire control CPU 608 through communication PCI buses 610, 612, and 614. Fire control platform CPU 608 controls the charging of the charging capacitors in both the MO and the PA which are charged in parallel by resonant charger 49. Fire control CPU 608 sets the HV target for each pulse and provides the trigger to begin charging. (This CPU also implements timing control and energy control algorithms discussed in more detail below). A timing energy module 618 receives signals from light detectors in MO and PA photo detector modules 620 and 622 and based on these signals and instructions from command module 616 provides feedback trigger signals to MO commutator 50A and PA commutator 50B which triggers switches initiating discharges from the MO and PA charging capacitors 42 as shown in FIG. 5 and initiates the pulse compressions resulting in the generation of discharge voltage in the peaking capacitors 82 to produce discharges in the MO and the PA. Additional details of the TEM are shown in FIG. 1D.

The preferred timing process is as follows: command module 616 sends trigger instructions to timing energy module 618 27 microseconds prior to a desired light out (i.e., time of first edge of laser pulse) providing the precise times for triggering switches 46 in both the MO and the PA. The TEM synchronizes timing signals with its internal clock by establishing a reference time called the "TEM reference" and then correlates trigger and light out signals to that reference time. The TEM then issues trigger signals to MO switch 46 in the MO commutator 50A with an accuracy better than about 250 picoseconds and a few ns later (in accordance with the instructions from command module 616) issues a trigger signal to the PA switch 46 in the PA commutator 50B also with an accuracy better than about 250 ps. The TEM then monitors the time of light out signals from PD modules 620 and 622 with an accuracy better than about 250 ps relative to the TEM reference time. These time data are then transmitted by the TEM 618 to command module 616 which analyzes these data and calculates the proper timing (based on algorithms discussed below) for the next pulse and 27 microseconds prior to the next pulse, command module 616 sends new trigger instructions to timing energy module 618. (The TEM can also monitor voltage on peaking capacitor banks 82 and feedback trigger control can also be based on the time voltages on the peaking capacitor banks cross a specified threshold.)

Thus, the discharge timing job is shared between TEM module 618 and command module 616. Communication between the two modules is along 10 megabit synchronous serial link shown at 617 in FIG. 1C. Module 618 provide extremely fast trigger generation and timing methodology and module 616 provides extremely fast calculations. Both working together are able to monitor timing, provide feedback, calculate the next timing signal using a complicated algorithm and provide two trigger signals to the commutators all within time windows of less than 250 microseconds and to assure relative triggering accuracy of the two discharges of less than about 2 to 5 billionths of a second! TEM module also provide a light out signal to stepper/scanner 2. This triggering process can be modified by instructions from the stepper/scanner 2 or by the laser operator through user interface paddle 602. High speed monitoring and trigger circuits of the type used in TEM module are available from suppliers such as Highland Technologies with offices in San Francisco; Berkley Nucleonics with offices in San Rafael, Calif., Anderson Engineering with offices in San Diego, Calif. and Stanford Research with offices in Pasadena, Calif. The importance of the accuracy of these timing circuits and issues and features relating to these trigger circuits are discussed in more detail below.

Timing modules like the TEM require sub-nanosecond time resolution. In preferred embodiments, Applicants employ a trick to achieve much better than 1-nanosecond resolution (i.e., about 100 ps resolution) with a wide dynamic range using a digital counter such as a 20 or 40 MHz crystal oscillator. The crystal oscillator provides clock signals at 25 or 50 ns intervals but these signals are utilized to charge a very linear analog capacitive charging circuit. The voltage on the capacitor is then read to determine time with sub-nanosecond accuracy.

Wavelength control is provided by LNM controller 624 with instructions from fire control command module 616 based on feedback signals from line center analysis module (LAM) 7 which monitors the output of the MO. Preferred techniques for measuring the line center wavelength are discussed below.

Control of other elements of the laser system is provided by a control area network (CAN) as indicated on FIG. 1C. CAN interface 626 interfaces with laser control platform 604 and provides control information to three CAN clusters: power cluster 628, left optics bay cluster 630, and right optics bay cluster 632. This CAN network provides two-way communication with these modules providing control from laser control platform 604 to the various modules and providing operational data from the modules back to the laser control platform.

Data acquirization can be provided through switch 636 and Cymer-on-Line module 634 which can collect and store huge amounts of data and make it available through Internet systems all as described in U.S. patent application Ser. No. 09/733,194, which is incorporated by reference herein. Field services port 638 provides access to CPU 608 and CPU 604 for special analysis and tests. Also eight BNC connectors 640 are available through digital-to-analog converter 642 for special monitors.

Test Results

Figure 6B:
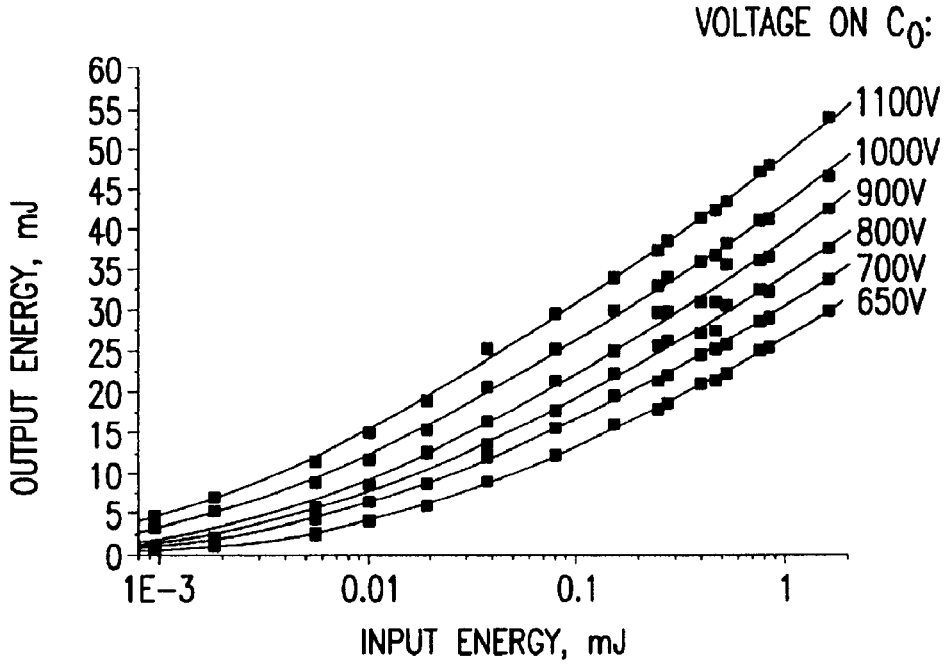
FIG. 6B shows the relationship between PA input and PA output.
Figure 6C:
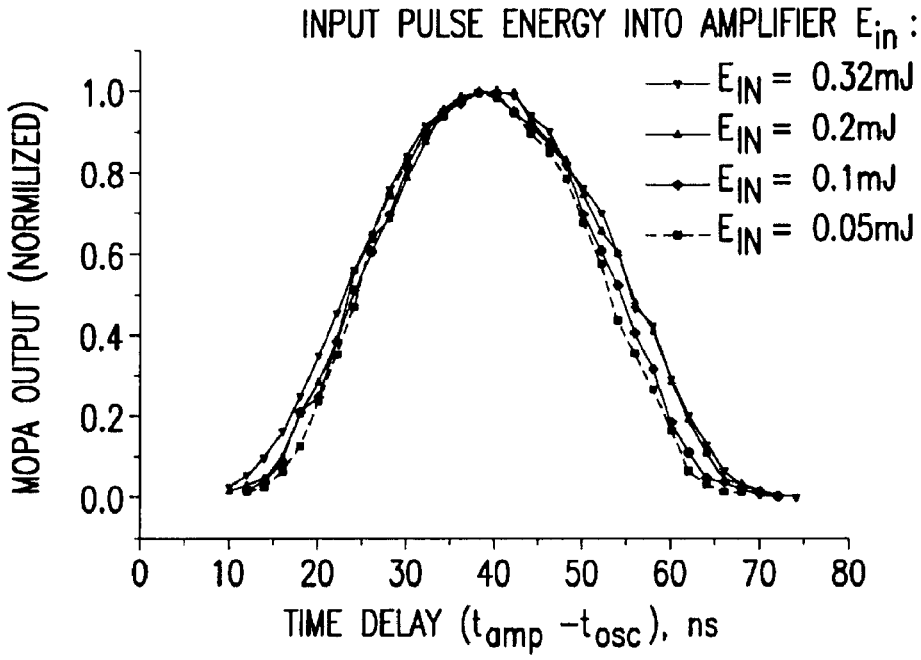
FIGS. 6C, 6D, 6E and 6F shows the effect of variations in time delay between MO discharge and PA discharge.
Figure 6D:
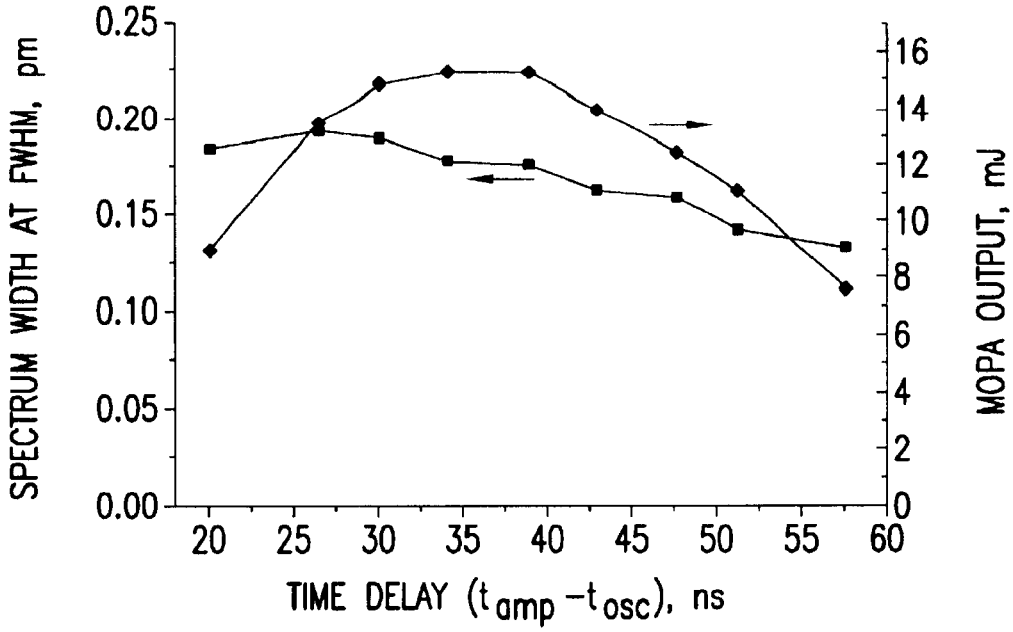
Figure 6E:
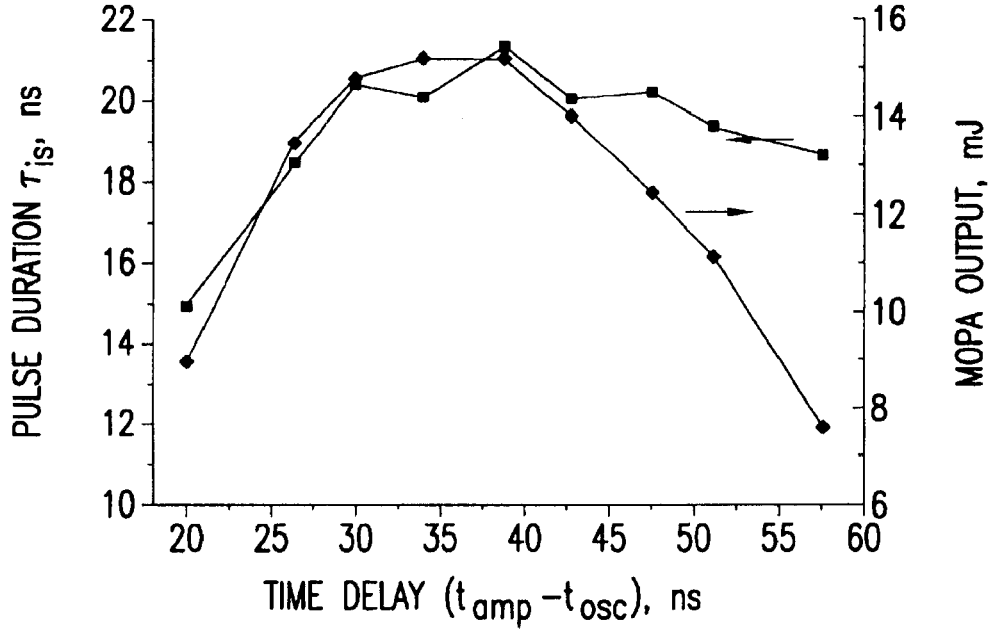

Applicants have conducted extensive testing of the basic MOPA configuration shown in FIG. 1 with various optical paths as shown in FIG. 6A1. The results are shown in 6A2. Designs that have been tested include single pass, straight double pass, single pass with divided amplifier electrodes and tilted double pass. FIG. 6B shows system output pulse energy as a function of PA input energy for the skewed double pass configuration at charging voltage ranging from 650 V to 1100 V. FIG. 6C shows the shape of the output pulse as a function of time delay between beginning of the oscillator and the amplifier pulses for four input energies. FIG. 6D shows the effect of time delay between pulses on output beam bandwidth. This graph also shows the effect of delay on output pulse energy. This graph shows that bandwidth can be reduced at the expense of pulse energy by increasing the delay. FIG. 6E shows that the laser system pulse duration can also be extended somewhat at the expense of pulse energy.

PULSE POWER SYSTEM

Pulse Power Circuit

Figure 4:
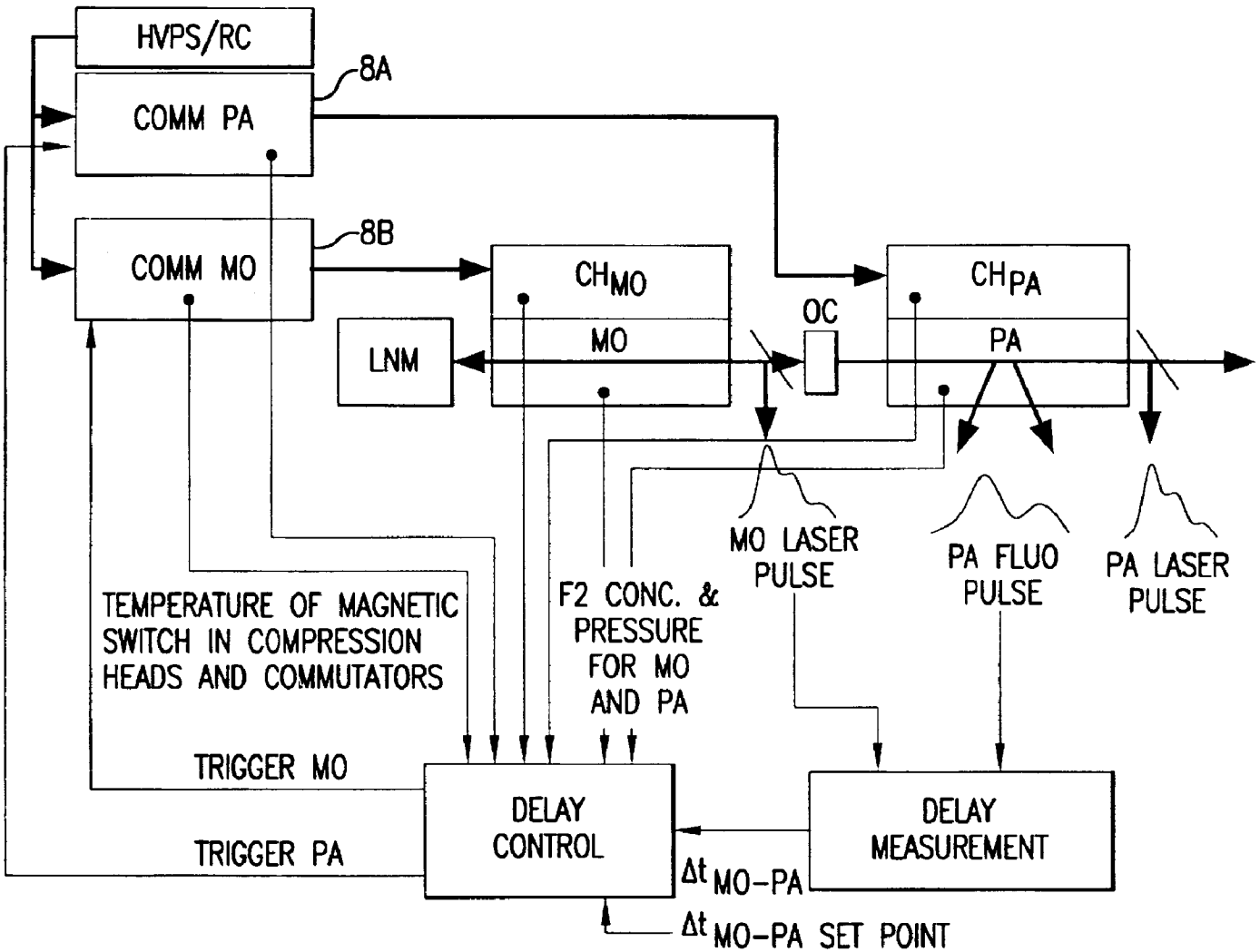
FIG. 4 is a block diagram showing features of a pulse power control technique.
Figure 4A:
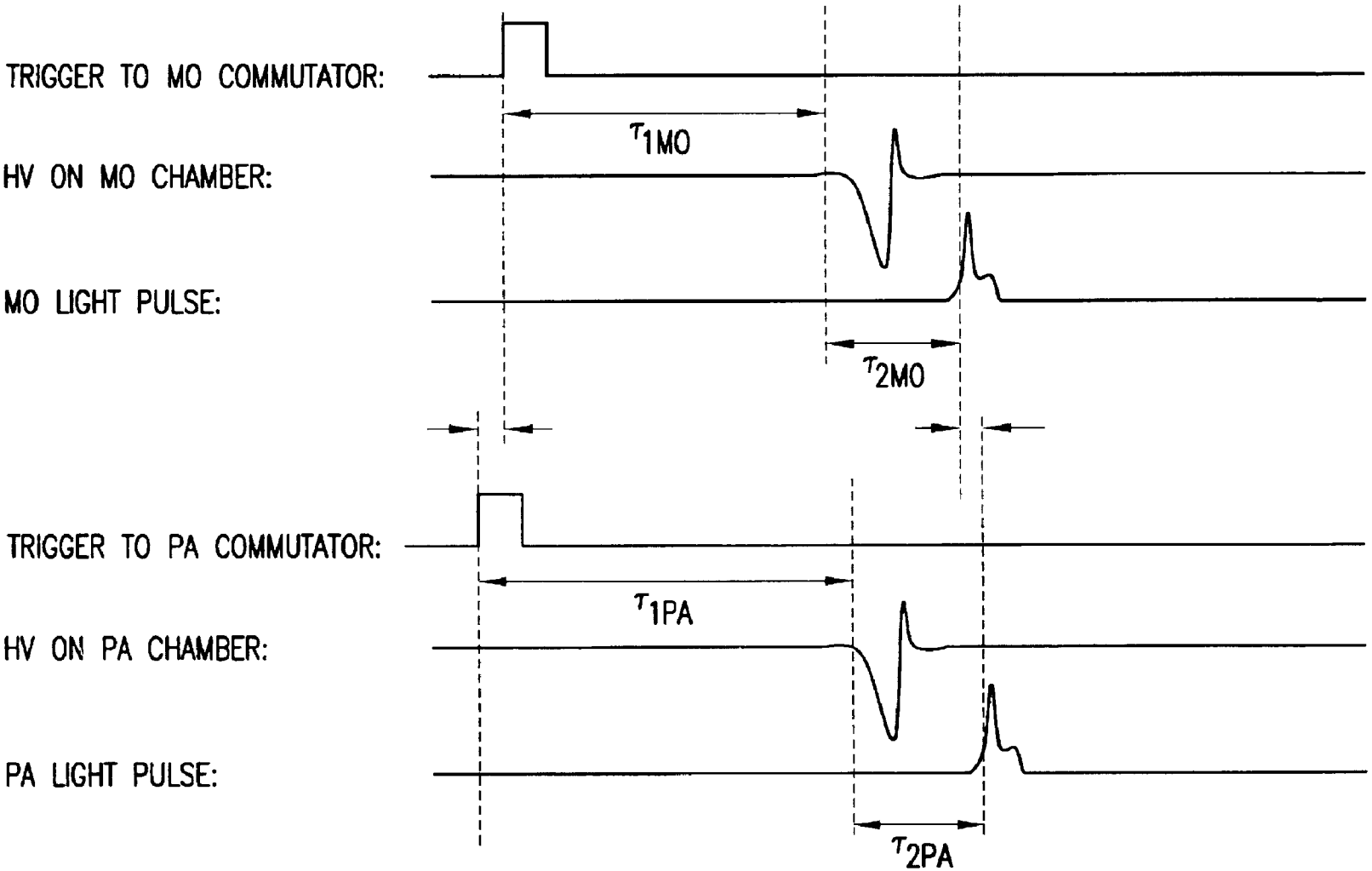
FIG. 4A shows the results of a trigger control technique.
Figure 4B:
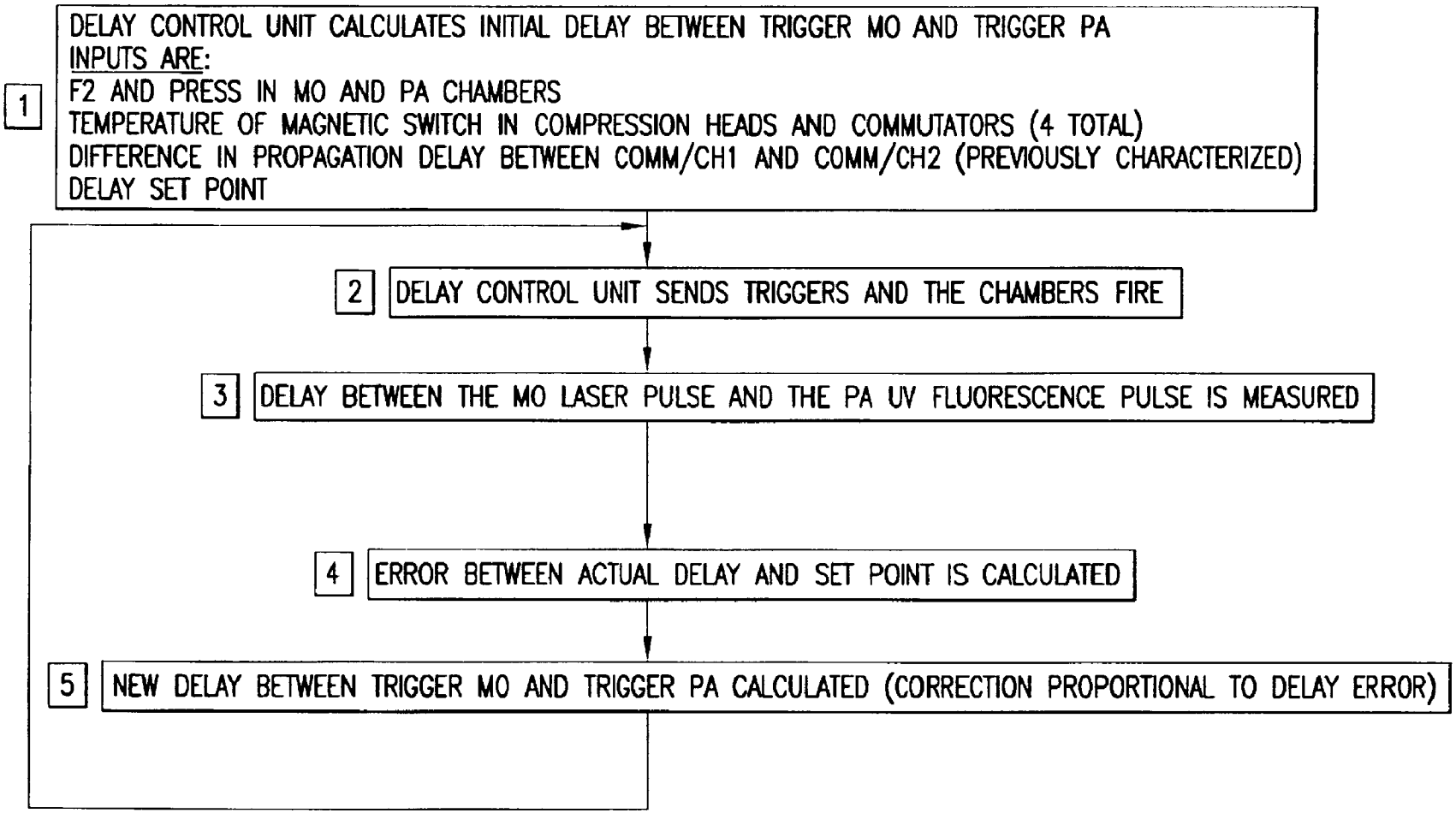
FIG. 4B is a block diagram showing features of a control algorithm.
Figure 5A:
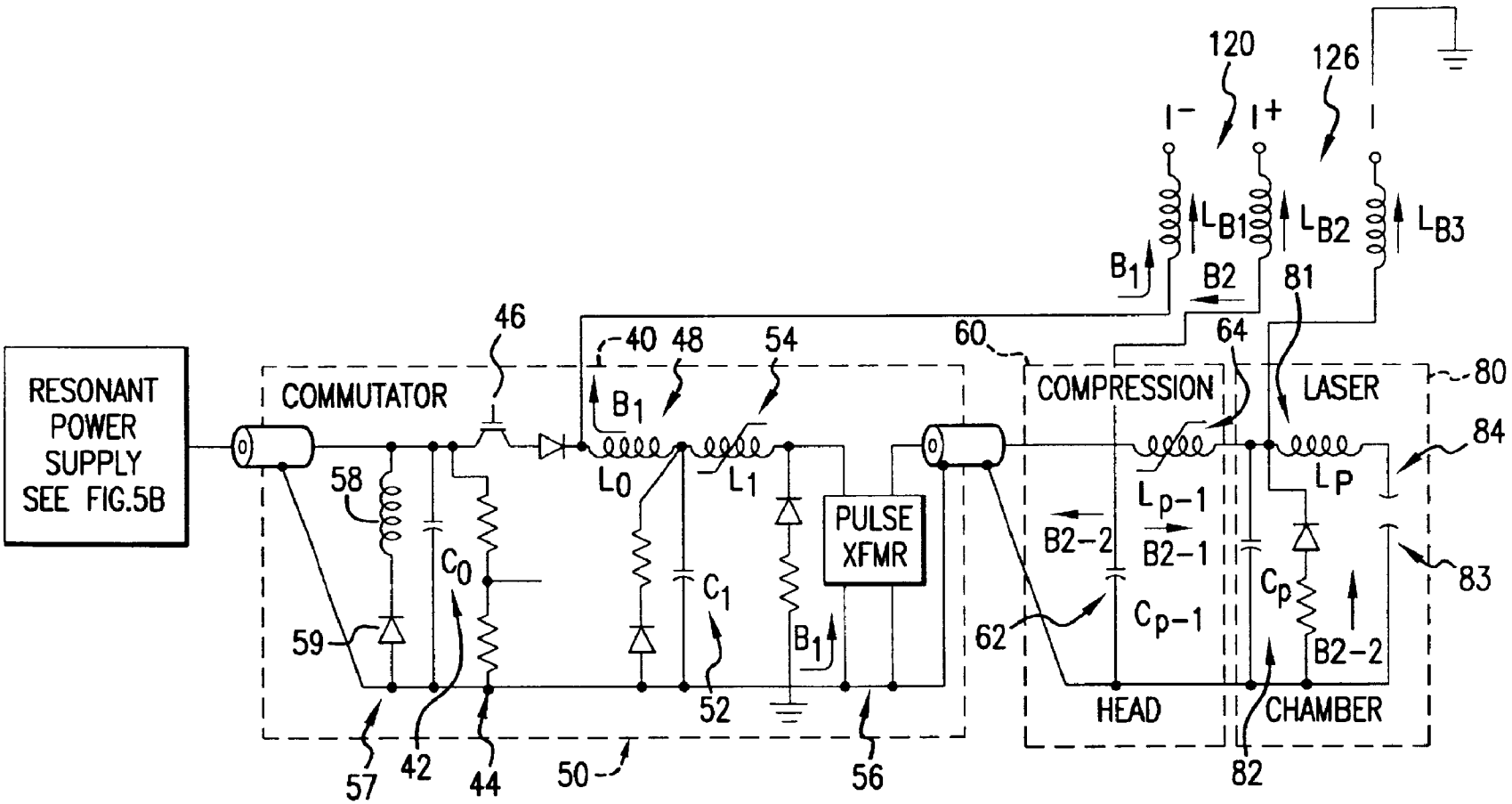
FIG. 5A is a circuit diagram of a pulse compression portion of a pulse power system.

In the preferred embodiment shown in FIG. 1 the basic pulse power circuits for both the MO and the PA are similar to pulse power circuits of prior art excimer laser light sources for lithography. Separate pulse power circuits downstream of the charging capacitors are provided for each discharge chamber. Preferably a single resonant charger charges two charging capacitor banks connected in parallel to assure that both charging capacitor banks are charged to precisely the same voltage. This preferred configuration is shown in FIG. 4 and FIG. 5C1. FIG. 5A shows important elements of a the basic pulse compression circuit which is used for both the MO and the PA. FIG. 5C2 shows a simplified version of this circuit.

Resonant Charger

Figure 5B:
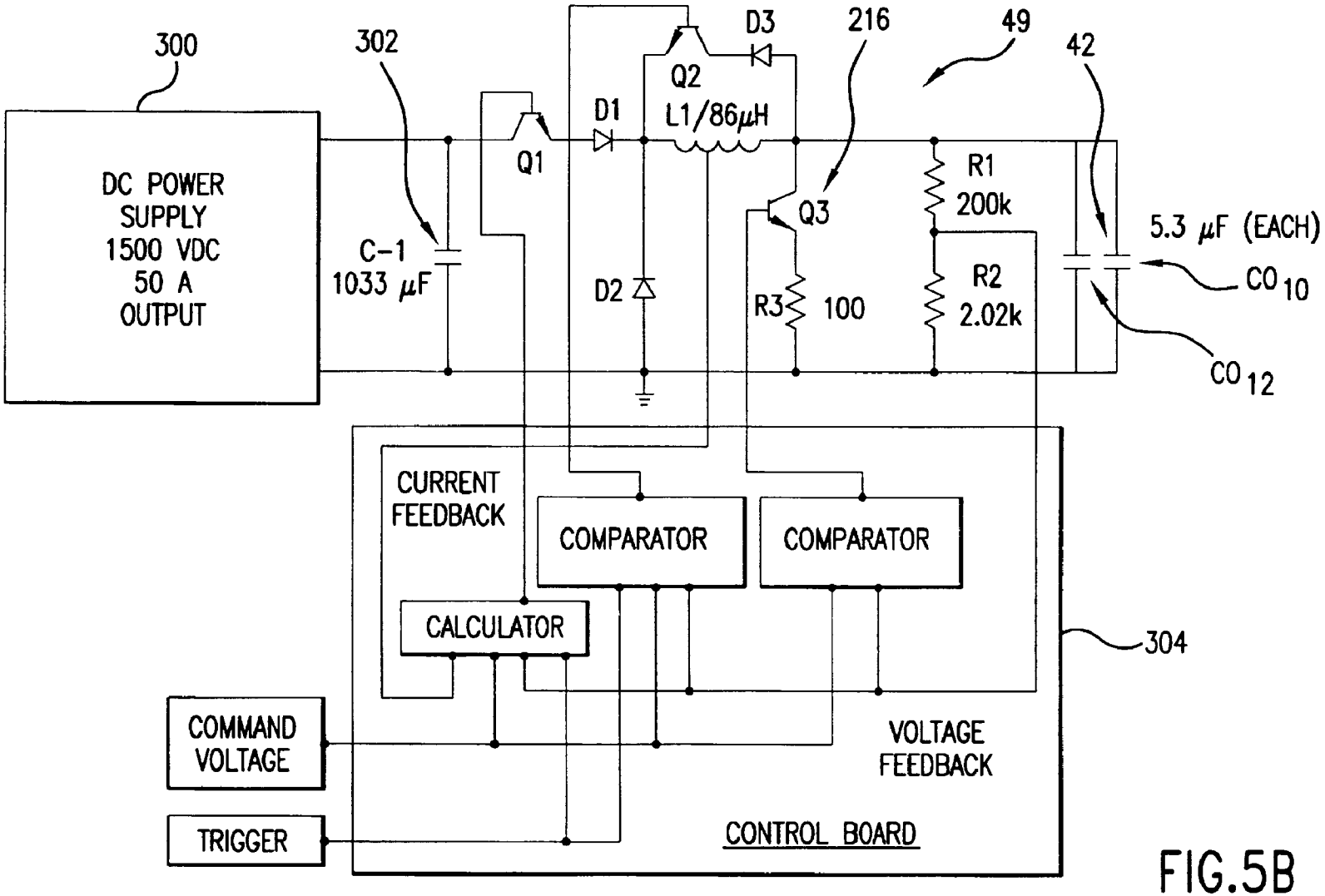
FIG. 5B is a block diagram-circuit diagram of a resonant charger system.

A preferred resonant charger system 49 is shown in FIG. 5B. The principal circuit elements are:

I1—A three-phase power supply 300 with a constant DC current output.

C-1—A source capacitor 302 that is an order of magnitude or more larger than $C_0$ capacitor banks 42. There are two of the capacitor banks $CO_{10}$ and $CO_{12}$ which are charged in parallel.

Q1, Q2, and Q3—Switches to control current flow for charging and maintaining a regulated voltage on $C_0$ capacitor banks.

D1, D2, and D3—Provides current single direction flow.

R1, and R2—Provides voltage feedback to the control circuitry.

R3—Allows for rapid discharge of the voltage on $C_0$ in the event of a small over charge.

L1—Resonant inductor between C-1 capacitor 302 and $C_0$ capacitor banks 42 to limit current flow and setup charge transfer timing.

Control Board 304—Commands Q1, Q2, and Q3 open and closed based upon circuit feedback parameters.

This circuit includes switch Q2 and diode D3, together known as a De-Qing switch. This switch improves the regulation of the circuit by allowing the control unit to short out the inductor during the resonant charging process. This "de-qing" prevents additional energy stored in the current of the charging inductor, L1, from being transferred to the $C_0$ capacitor banks.

Prior to the need for a laser pulse the voltage on C-1 is charged to 600-800 volts and switches Q1-Q3 are open. Upon command from the laser, Q1 closes. At this time current would flow from C-1 to $C_0$ through the charge inductor L1. As described in the previous section, a calculator on the control board evaluates the voltage on $C_0$ and the current flowing in L1 relative to a command voltage set point from the laser. Q1 opens when the voltage on the CO capacitor banks plus the equivalent energy stored in inductor L1 equals the desired command voltage. The calculation is:

$$V_f=[V_{COs}^2+((L_1*I_{Lis}^2)/C_O)]^{0.5}$$

Where:

$V_f$=The voltage on $C_0$ after Q1 opens and the current in L1 goes to zero.

$V_{COs}$=The voltage on $C_0$ when Q1 opens.

$I_{L1s}$=The current flowing through $L_1$ when Q1 opens.

After Q1 opens the energy stored in L1 starts transferring to the CO capacitor banks through D2 until the voltage on the CO capacitor banks approximately equals the command voltage. At this time Q2 closes and current stops flowing to CO and is directed through D3. In addition to the "de-qing" circuit, Q3 and R3 form a bleed-down circuit which allows additional fine regulation of the voltage on CO.

Switch Q3 of bleed down circuit 216 will be commanded closed by the control board when current flowing through inductor L1 stops and the voltage on $C_0$ will be bled down to the desired control voltage; then switch Q3 is opened. The time constant of capacitor $C_o$ and resistor R3 should be sufficiently fast to bleed down capacitor $C_o$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on the CO capacitor banks nears the target value, the de-qing switch is closed, stopping the resonant charging when the voltage on $C_o$ is at or slightly above the target value. In a preferred embodiment, the switch Q1 and the de-qing switch is used to provide regulation with accuracy better than +/−0.1%. If additional regulation is required, the third control over the voltage regulation could be utilized. This is the bleed-down circuit of switch Q3 and R3 (shown at 216 in FIG. 5B) to discharge the CO's down to the precise target value.

Improvements Downstream of the CO's

As indicated above, the pulse power system of the MO and the PA of their preferred embodiment each utilizes the same basic design (FIG. 5A) as was used in single chamber systems as described in U.S. application Ser. No. 10/036/676. Important advancements described and claimed herein relate to the combining of these two separate pulse power system to assure efficient laser operation with precise timing control and precise control of laser beam quality. In addition, some significant improvements which were described in the above parent applications were required for the approximate factor of 3 increase in heat load resulting from the greatly increased repetition rate as compared to prior art lithographic laser systems. These improvements are discussed below.

Detailed Commutator and Compression Head Description

In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similar to those used in prior systems as described in U.S. Pat. Nos. 5,448,580 and 5,315,611.

Figure 7A:
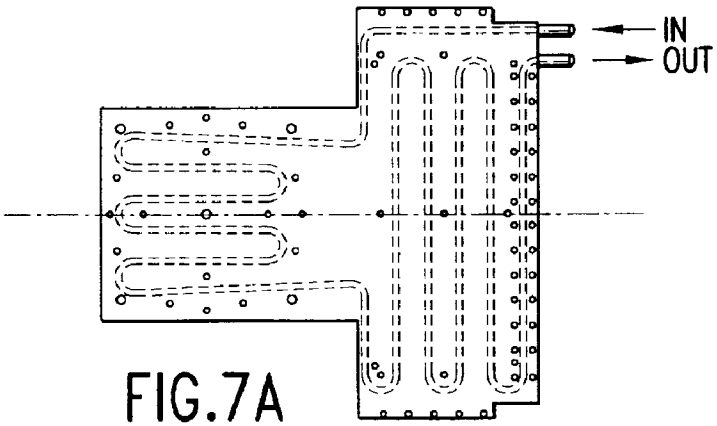
FIGS. 7, 7A, 8, 9, 9A and 9B illustrate pulse power components and techniques to cool them.
Figure 7:
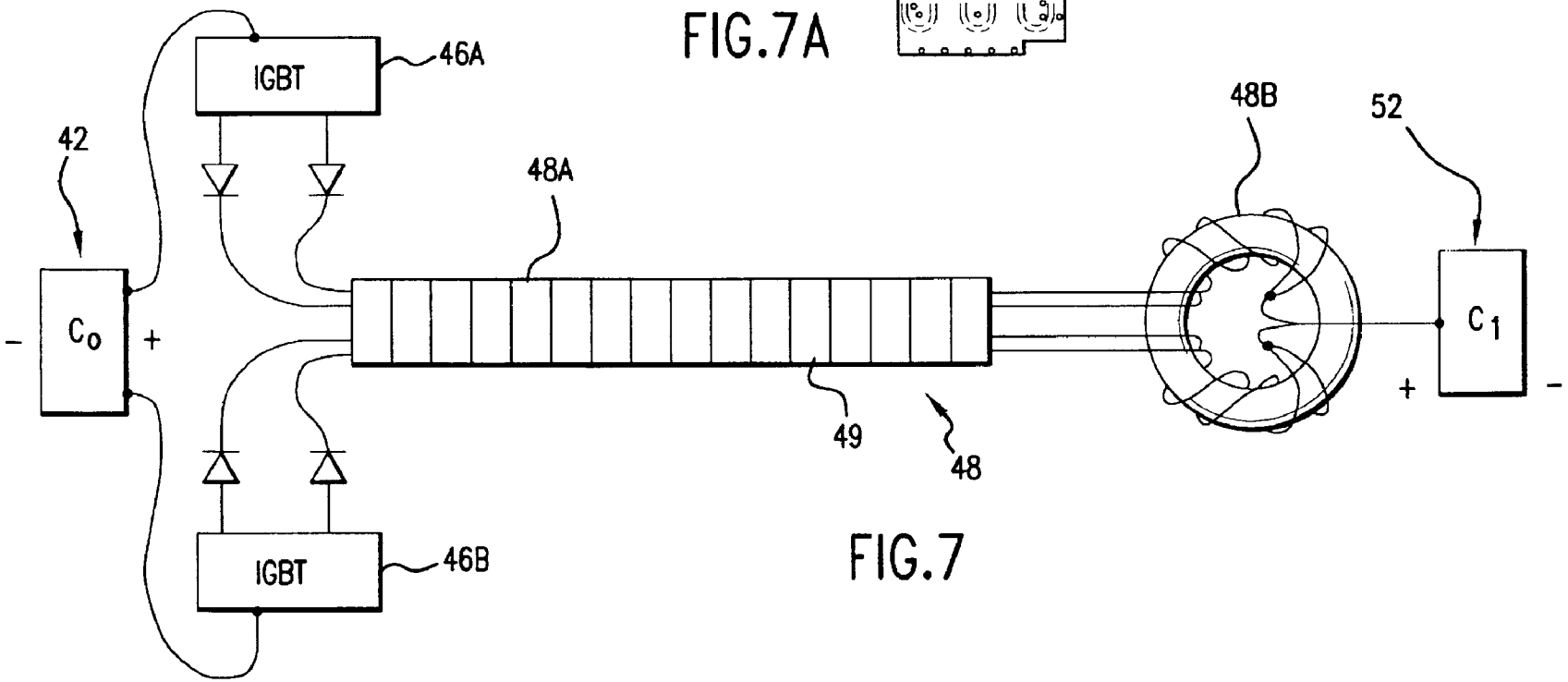

FIG. 7 shows a preferred design of the $L_o$ inductor 48. In this inductor tour conductors from the two IGBT switches 46B pass through sixteen ferrite toroids 49 to form part 48A an 8 inch long hollow cylinder of very high permeability material with an ID of about 1 inch and an OD of about 1.5 inch. Each of the four conductors are then wrapped twice around an insulating doughnut shaped core to form part 48B. The four conductors then connect to a plate which is in turn connected to the high voltage side of the $C_1$ capacitor bank 52.

Figure 8:
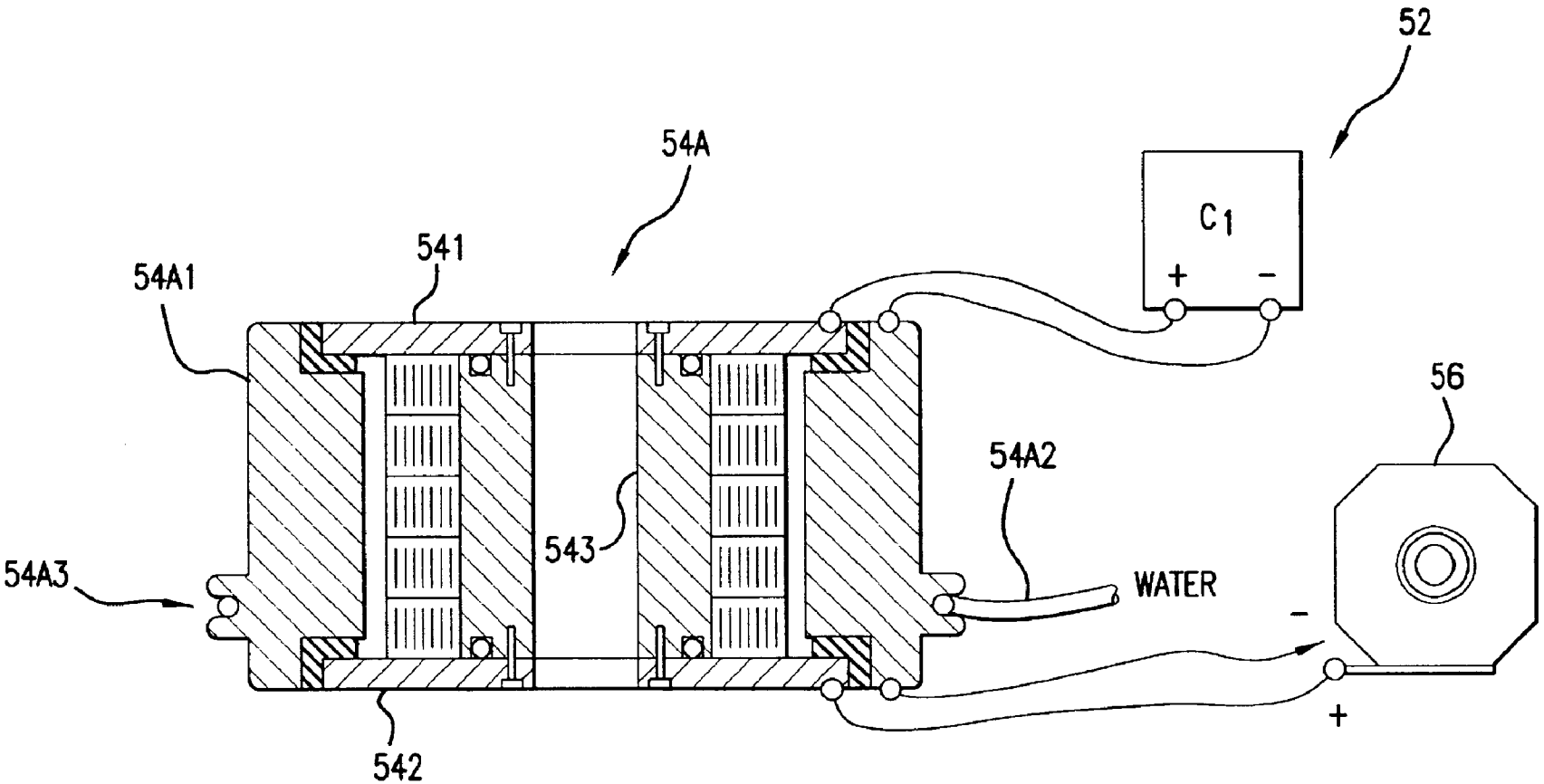

A preferred sketch of saturable inductor 54A is shown in FIG. 8. In this case, the inductor is a single turn geometry where the assembly top and bottom lids 541 and 542 and center mandrel 543, all at high voltage, form the single turn through the inductor magnetic cores. The outer housing 54A1 is at ground potential. The magnetic cores are 0.0005" thick tape wound 50-50% Ni—Fe alloy provided by Magnetics of Butler, Pa. or National Arnold of Adelanto, Calif. In addition, a ceramic disk (not shown) is mounted underneath the reactor bottom lid to help transfer heat from the center section of the assembly to the module chassis base plate. FIG. 8 also shows the high voltage connections to one of the capacitors of the $C_1$ capacitor bank 52 and to a high voltage lead on one of the induction units of the 1:25 step up pulse transformer 56. The housing 545 is connected to the ground lead of unit 56.

This inductor is cooled by a water cooled jacket 54A1. The cooling line 54A2 is routed within the module to wrap around jacket 54A1 and through aluminum base plate where the IGBT switches and Series diodes are mounted. These three components make up the majority of the power dissipation within the module. Other items that also dissipate heat (snubber diodes and resistors, capacitors, etc.) are cooled by forced air provided by the two fans in the rear of the module.

Since the jacket 54A1 is held at ground potential, there are no voltage isolation issues in directly attaching the cooling tubing to the reactor housing. This is done by press-fitting the tubing into a dovetail groove cut in the outside of the housing as shown at 54A3 and using a thermally conductive compound to aid in making good thermal contact between the cooling tubing and the housing.

Figure 9:
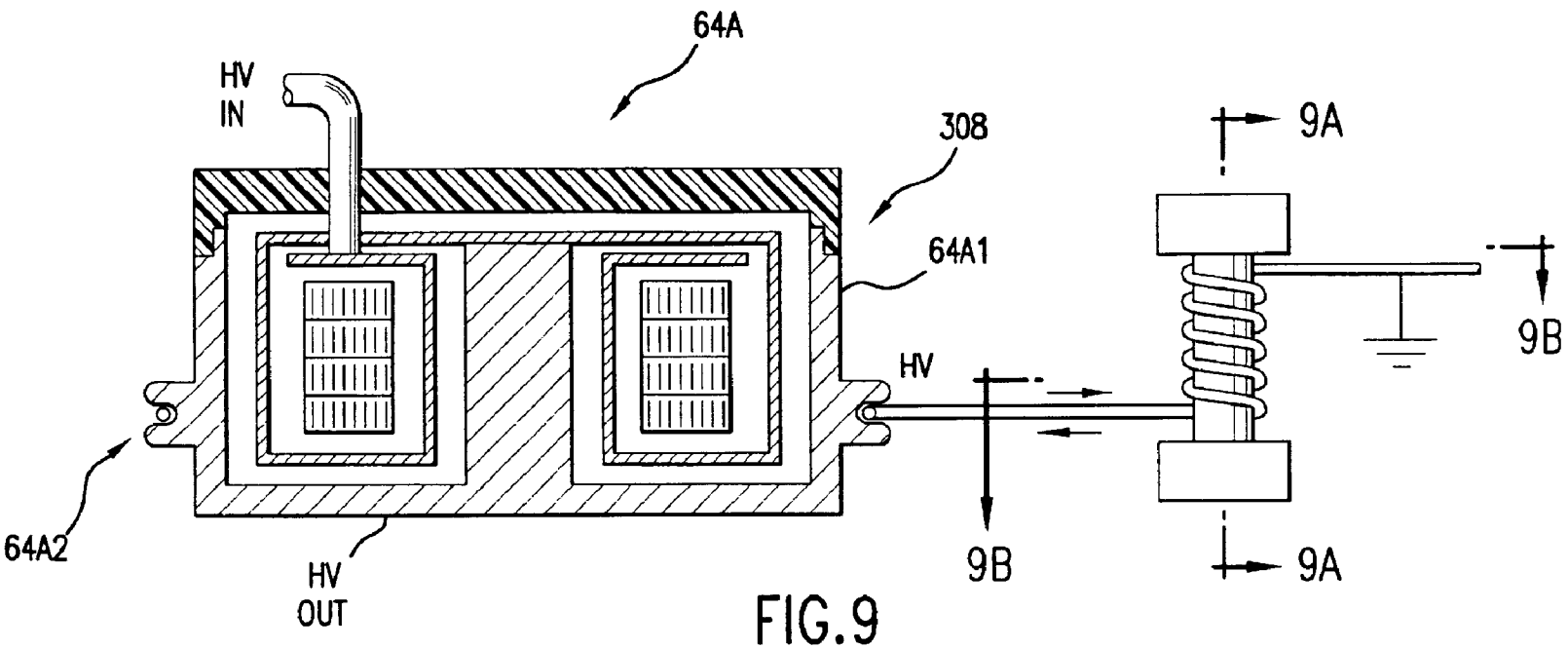
Figure 9B:
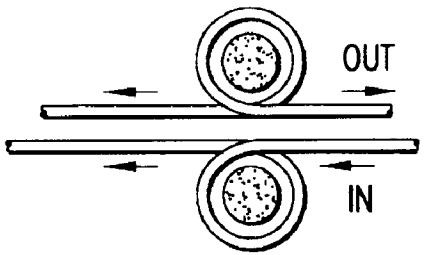
Figure 9A:
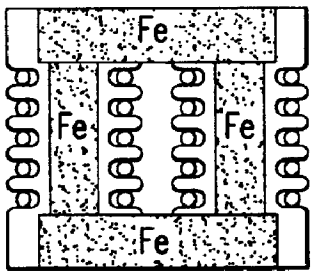

The water-cooled compression head is similar in the electrical design to a prior art air-cooled version (the same type ceramic capacitors are used and similar material is used in the reactor designs). The primary differences in this case are that the module must run at higher rep-rates and therefore, higher average power. In the case of the compression head module, the majority of the heat is dissipated within the modified saturable inductor 64A. Cooling the subassembly is not a simple matter since the entire housing operates with short pulses of very high voltages. The solution to this issue as shown in FIGS. 9, 9A and 9B is to inductively isolate the housing from ground potential. This inductance is provided by wrapping the cooling tubing around two cylindrical forms that contain a ferrite magnetic core. Both the input and output cooling lines are coiled around cylindrical portions of a ferrite core formed of the two cylindrical portions and the two ferrite blocks as shown in FIGS. 9, 9A and 9B.

The ferrite pieces are made from CN-20 material manufactured by Ceramic Magnetics, Inc. of Fairfield, N.J. A single piece of copper tubing (0.187" diameter) is press fit and wound onto one winding form, around the housing 64A1 of inductor 64A and around the second winding form. Sufficient length is left at the ends to extend through fittings in the compression head sheet metal cover such that no cooling tubing joints exist within the chassis.

The inductor 64A comprises a dovetail groove as shown at 64A2 similar to that used in the water-cooled commutator first stage reactor housing. This housing is much the same as previous air-cooled versions with the exception of the dovetail groove. The copper cooling-water tubing is press fit into this groove in order to make a good thermal connection between the housing and the cooling-water tubing. Thermally conductive compound is also added to minimize the thermal impedance. Inductor 64A provides two loops around magnetic core 64A3 which is comprised of four coils of tape.

Bias current as shown in FIG. 5A is supplied by a dc-dc converter in the commutator through a cable into the compression head. The current passes through the "positive" bias inductor $L_{B2}$ and is connected to the Cp−1 voltage node. The current then splits with a portion returning to the commutator through the HV cable (passing through the transformer secondary to ground and back to the dc-dc converter). The other portion passes through the compression head reactor Lp−1 (to bias the magnetic switch) and then through the cooling-water tubing "negative" bias inductor $L_{B3}$ and back to ground and the dc-dc converter. By balancing the resistance in each leg, the designer is able to ensure that sufficient bias current is available for both the compression head reactor and the commutator transformer.

The "positive" bias inductor $L_{B2}$ is made very similarly to the "negative" bias inductor $L_{B3}$. In this case, the same ferrite bars and blocks are used as a magnetic core. However, two 0.125" thick plastic spacers are used to create an air gap in the magnetic circuit so that the cores do not saturate with the dc current. Instead of winding the inductor with cooling-water tubing, 18 AWG teflon wire is wound around the forms.

Cooling Other High Voltage Components

Although the IGBT switches "float" at high voltage, they are mounted on an aluminum base electrically isolated from the switches by a 1/16 inch thick alumina plate. The aluminum base plate which functions as a heat sink and operates at ground potential and is much easier to cool since high voltage isolation is not required in the cooling circuit. A drawing of a water cooled aluminum base plate is shown in FIG. 7A. In this case, the cooling tubing is pressed into a groove in an aluminum base on which the IGBT's are mounted. As with the inductor 54a, thermally conductive compound is used to improve the overall joint between the tubing and the base plate.

The series diodes also "float" at high potential during normal operation. In this case, the diode housing typically used in the design provides no high voltage isolation. To provide this necessary insulation, the diode "hockey puck" package is clamped within a heat sink assembly which is then mounted on top of a ceramic base that is then mounted on top of the water-cooled aluminum base plate. The ceramic base is just thick enough to provide the necessary electrical isolation but not too thick to incur more than necessary thermal impedance. For this specific design, the ceramic is 1/16 thick alumina although other more exotic materials, such as beryllia, can also be used to further reduce the thermal impedance between the diode junction and the cooling water.

A second embodiment of a water cooled commutator utilizes a single cold plate assembly which is attached to the chassis baseplate for the IGBT's and the diodes. The cold plate may be fabricated by brazing single piece nickel tubing to two aluminum "top" and "bottom" plates. As described above, the IGBT's and diodes are designed to transfer their heat into the cold plate by use of the previously mentioned ceramic disks underneath the assembly. In a preferred embodiment of this invention, the cold plate cooling method is also used to cool the IGBT and the diodes in the resonant charger. Thermally conductive rods or a heat pipe can also be used to transfer heat from the outside housing to the chassis plate.

In prior art pulse power systems, oil leakage from electrical components has been a potential problem. In this preferred embodiment, oil insulated components are limited to the saturable inductors. Furthermore, the saturable inductor 64 as shown in FIG. 9 is housed in a pot type oil containing housing in which all seal connections are located above the oil level to substantially eliminate the possibility of oil leakage. For example, the lowest seal in inductor 64 is shown at 308 in FIG. 9.

Capacitors

Capacitor banks 42, 52, 62 and 82 (i.e., $C_o$, $C_1$, $C_{p-1}$ and $C_p$) as shown in FIG. 5A are all comprised of banks of offthe-shelf capacitors connected in parallel. Capacitors 42 and 52 are film type capacitors available from suppliers such as Vishay Roederstein with offices in Statesville, N.C. and Wima of Germany. Applicants' preferred method of connecting the capacitors and inductors is to solder them to positive and negative terminals on special printed circuit board having heavy nickel coated copper leads in a manner similar to that described in U.S. Pat. No. 5,448,580. Capacitor banks 62 and 64 are typically comprised of a parallel array of high voltage ceramic capacitors from vendors such as Murata or TDK, both of Japan. In a preferred embodiment for use on this ArF laser, capacitor bank 82 (i.e., $C_p$) comprised of a bank of thirty three 0.3 nF capacitors for a capacitance of 9.9 nF; $C_{p-1}$ is comprised of a bank of twenty four 0.40 nF capacitors for a total capacitance of 9.6 nF; $C_1$ is a 5.7 μF capacitor bank and $C_o$ is a 5.3 μF capacitor bank.

Pulse Transformer

Figure 10:
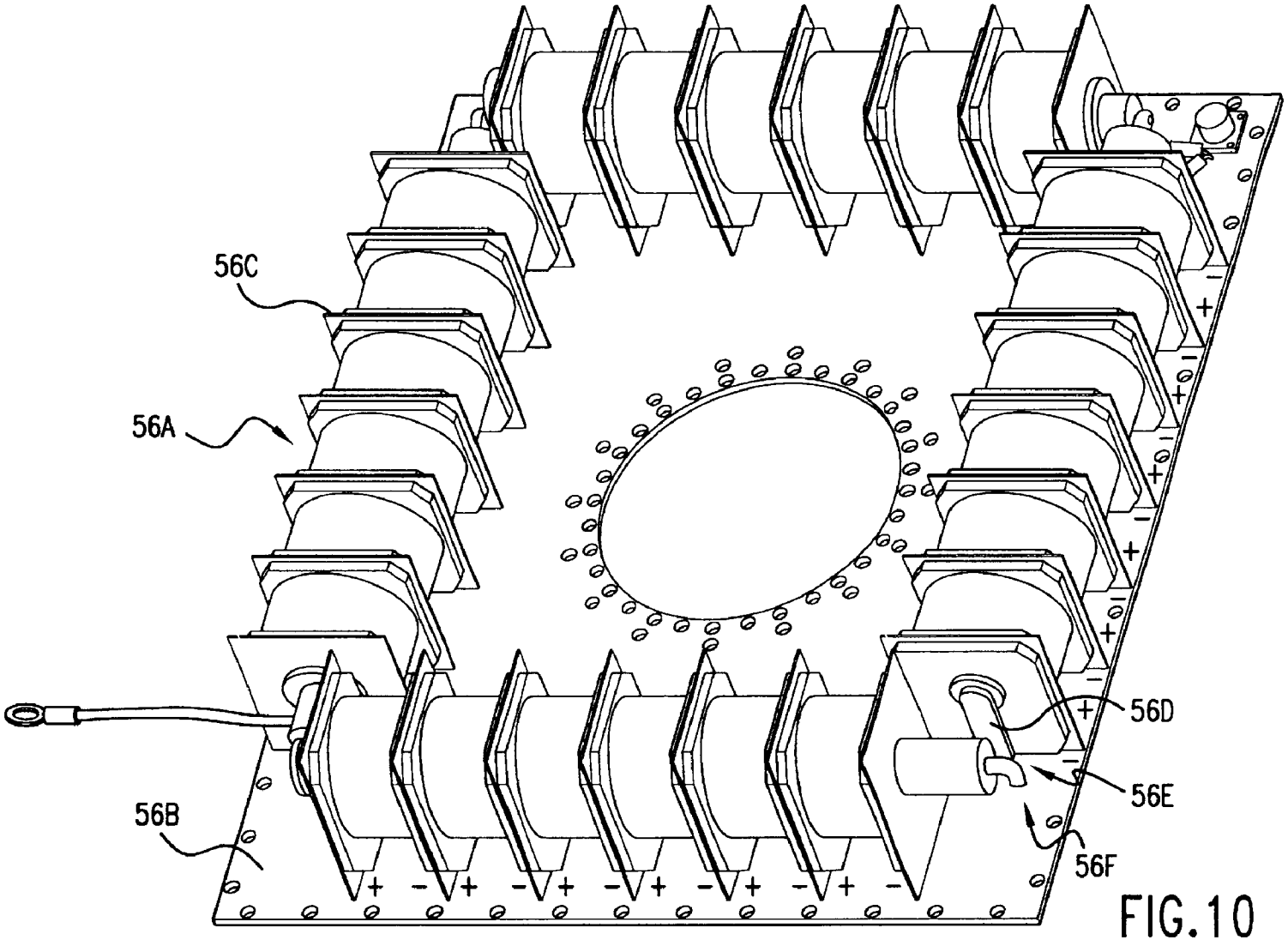
FIGS. 10 and 10A show features of a pulse transformer.
Figure 10A:
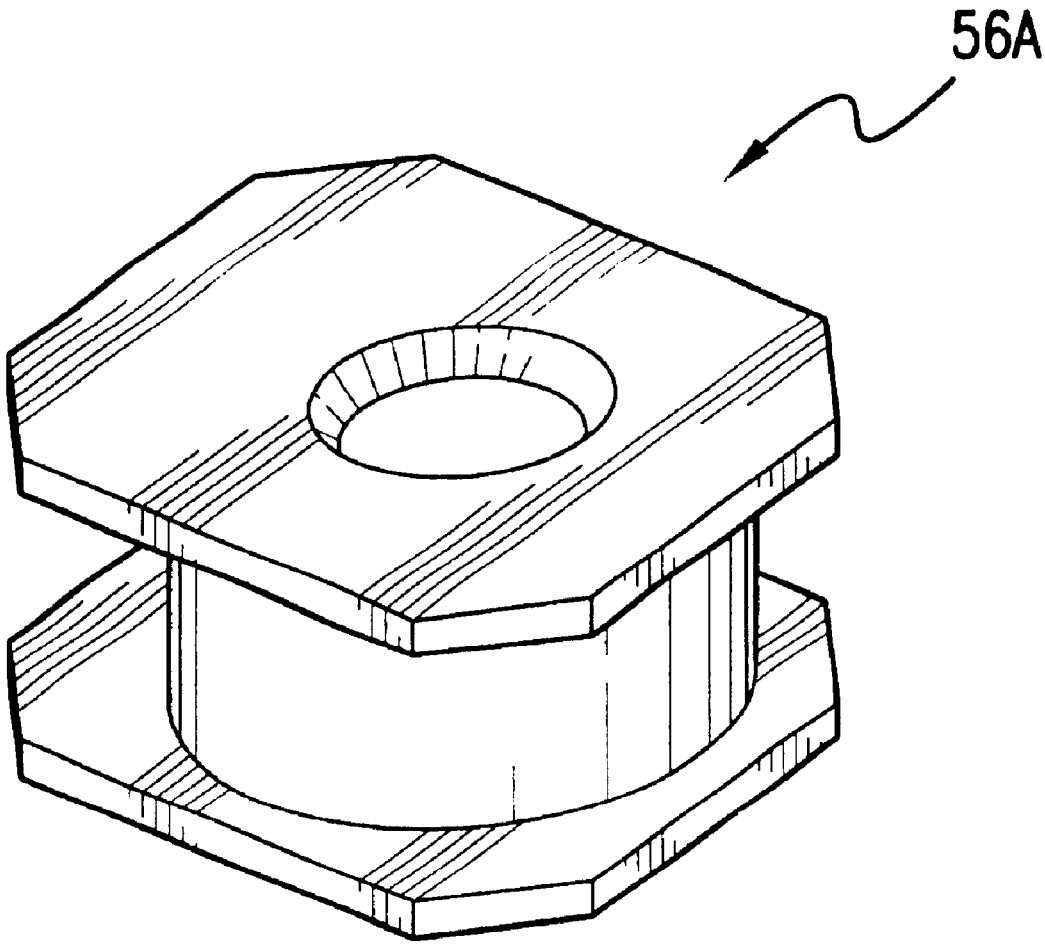

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. A drawing of pulse transformer 56 is shown in FIG. 10. Each of the 24 induction units comprise an aluminum spool 56A having two flanges (each with a flat edge with threaded bolt holes) which are bolted to positive and negative terminals on printed circuit board 56B as shown along the bottom edge of FIG. 10. (The negative terminals are the high voltage terminals of the twenty four primary windings.) Insulators 56C separate the positive terminal of each spool from the negative terminal of the adjacent spool. Between the flanges of the spool is a hollow cylinder 1 1/16 inches long with a 0.875 OD with a wall thickness of about 1/32 inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 10A.

The secondary of the transformer is a single stainless steel rod mounted within a tight fitting insulating tube of PTFE (Teflon®). The winding is in four sections as shown in FIG. 10. The low voltage end of stainless steel secondary shown as 56D in FIG. 10 is tied to the primary HV lead on printed circuit board 56B at 56E, the high voltage terminal is shown at 56F. As a result, the transformer assumes an autotransformer configuration and the step-up ratio becomes 1:25 instead of 1:24. Thus, an approximately −1400 volt pulse between the + and − terminals of the induction units will produce an approximately −35,000 volt pulse at terminal 56F on the secondary side. This single turn secondary winding design provides very low leakage inductance permitting extremely fast output rise time.

Details of Laser Chamber Electrical Components

The Cp capacitor 82 is comprised of a bank of thirty-three 0.3 nf capacitors mounted on top of each of the MO and PA chamber pressure vessels. (Typically an ArF laser is operated with a lasing gas made up of 3.5% argon, 0.1% fluorine, and the remainder neon.) The electrodes are about 28 inches long which are separated by about 0.5 to 1.0 inch preferably about 5/8 inch. Preferred electrodes are described below. In this embodiment, the top electrode is referred to as the cathode and is provided with high voltage negative pulses in the range of about 12 KV to 20 KV for ArF lasers and the bottom electrode is connected to ground as indicated in FIG. 5A and is referred to as the anode.

Discharge Timing

By reference to FIG. 1C, Applicants have described above in detail a preferred feedback trigger control technique for timing the discharges in the MO and the PA. In this section Applicants explain other discharge timing issues and features.

In ArF, KrF and $F_2$ electric discharge lasers, the electric discharge lasts only about 50 ns (i.e., 50 billionths of a second). This discharge creates a population inversion necessary for lasing action but the inversion only exists during the time of the discharge. Therefore, an important requirement for an injection seeded ArF, KrF or $F_2$ laser is to assure that the seed beam from the master oscillator passes through discharge region of the power amplifier during the approximately (40 to 50 billionths of a second) when the population is inverted in the laser gas so that amplification of the seed beam can occur. An important obstacle to precise timing of the discharge is the fact that there is a delay of about 5 microseconds (i.e., 50,000 ns) between the time switch 42 (as shown in FIG. 5A) is triggered to close and the beginning of the discharge which lasts only about 40-50 ns. It takes this approximately 5 microseconds time interval for the pulse to ring through the circuit between the $C_0$'s and the electrodes. This time interval varies substantially with the magnitude of the charging voltage and with the temperature of the saturable inductors in the circuit.

Nevertheless in preferred embodiments of the present invention described herein, Applicants have developed electrical pulse power circuits that provide timing control of the discharges of the two discharge chambers within a relative accuracy of less than about 2 to 5 ns (i.e., 2 to 5 billionths of a second). Simplified block diagrams of such circuits are shown in FIGS. 4 and 5C1.

Applicants have conducted tests which show that timing varies with charging voltage by approximately 5-10 ns/volt. This places a stringent requirement on the accuracy and repeatability of the high voltage power supply charging the charging capacitors. For example, if timing control of 5 ns is desired, with a shift sensitivity of 10 ns per volt, then the resolution accuracy of the charging circuit would be 0.5 Volts. For a nominal charging voltage of 1000 V, this would require a charging accuracy of 0.05% which is very difficult to achieve especially when the capacitors must be charged to those specific values at the rate of 4000 times per second or greater.

Figure 4C:
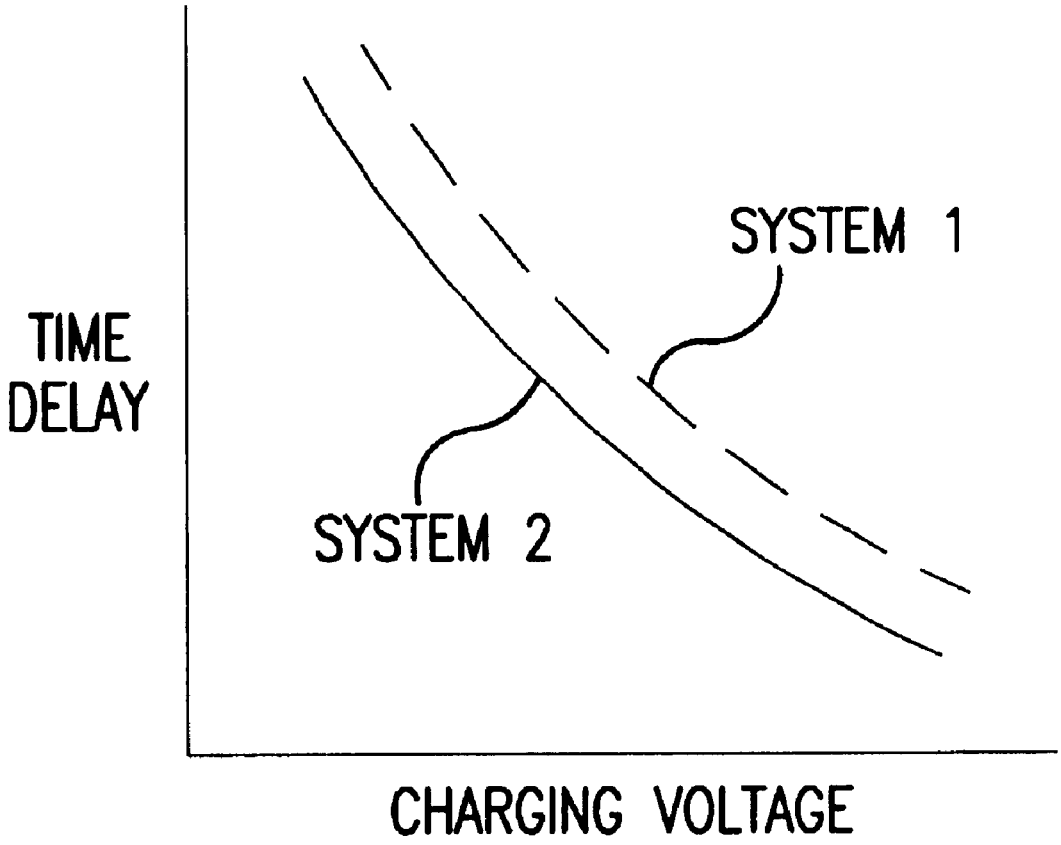
FIG. 4C shows response times of two similar laser units.

Applicants' preferred solution to this problem, as described above, is to charge the charging capacitor bank of both the MO and the PA in parallel from the single resonant charger 7 as indicated in FIG. 4 and FIG. 5C1. It is also important to design the two pulse compression/amplification circuits for the two systems so that time delay versus charging voltage curves match as shown in FIG. 4C. This is done most easily by using to the extent possible the same components in each circuit.

Thus, in order to minimize timing variations (these variations are referred to as jitter) in this preferred embodiment, Applicants have designed pulse power components for both discharge chambers with similar components and have confirmed that the time delay versus voltage curves do in fact track each other as indicated in FIG. 4C. Applicants have confirmed that over the normal operating range of charging voltage, there is a substantial change in time delay with voltage but the change with voltage is virtually the same for both circuits. Thus, with both charging capacitors charged in parallel charging voltages can be varied over a wide operating range without changing the relative timing of the discharges.

Temperature control of electrical components in the pulse power circuit is also important since temperature variations can affect pulse compression timing (especially temperature changes in the saturable inductors). Therefore, a design goal is to minimize temperature variations, a second approach is to match the pulse power components in both the MO and the PA so that any temperature changes in one circuit will be duplicated in the other circuit and a third approach is to monitor temperature of the temperature sensitive components and, if needed, use a feedback or feedforward control to adjust the trigger timing to compensate. For typical lithography light source applications, it is not practical to avoid temperature changes, since the normal mode of operation is the burst mode described above which produces significant temperature swings in pulse power components. Controls can be provided with a processor programmed with a learning algorithm to make adjustments based on historical data relating to past timing variations with known operating histories. This historical data is then applied to anticipate timing changes based on the current operation of the laser system. Typically, adjustments for relative temperature changes will not be necessary during continuous operation since feedback control will automatically correct for temperature variations which are generally relatively slow compared to operating pulse intervals. However, correction for temperature changes could be important for the first pulse or the first few pulses following an idle period.

Trigger Control

The triggering of the discharge for each of the two chambers can be accomplished separately utilizing for each circuit a trigger circuit such as one of those described in U.S. Pat. No. 6,016,325. These circuits can add timing delays to correct for variations in charging voltage and temperature changes in the electrical components of the pulse power so that the time between trigger and discharge is held as constant as feasible. As indicated above, since the two circuits are basically the same, the variations after correction are almost equal (i.e., within about 2-5 ns of each other).

As indicated in FIGS. 6C, D, and E, performance of this preferred embodiment is greatly enhanced if the discharge in the power amplifier is timed to begin within a specific window about 2-5 ns wide and occurring about 40 to 50 ns after the discharge in the master oscillator. The 40 to 50 ns delay is because it takes several nanoseconds for the laser pulse to develop in the master oscillator and another several nanoseconds for the front part of the laser beam from the oscillator to reach the amplifier and because the rear end of the laser pulse from the master oscillator is at a much narrower bandwidth than the front part. Separate trigger signals are provided to trigger switch 46 as shown in FIG. 5A for each chamber. The actual delay is chosen to achieve desired beam quality based on actual performance curves such as those shown in FIGS. 6C, D and E. The delay is typically optimized for approximately maximum efficiency but may be optimized for other parameters. The reader should note, for example, that narrower bandwidth and longer pulses can be obtained at the expense of pulse energy by increasing the delay between MO trigger and PA trigger. As shown in FIG. 6C, for maximum laser efficiency (i.e., maximum output at a given discharge voltage and given input pulse energy) the timing delay should be within about 2 to 5 ns of optimum time delay.

Other Techniques To Control Discharge Timing

Since the relative timing of the discharges can have important effects on beam quality as indicated in the FIGS. 6C, D and E graphs, additional steps may be justified to control the discharge timing. For example, some modes of laser operation (specifically for example burst mode operation) result in significant swings in charging voltage or wide swings in inductor temperature.

Monitor Timing

The timing of the discharges can be monitored on a pulse-to-pulse basis and the time difference can be used in a feedback control system to adjust timing of the trigger signals closing switch 42. Preferably, the PA discharge would be monitored using a photocell to observe discharge fluorescence (called ASE) rather than the laser pulse since very poor timing could result if no laser beam being produced in the PA. For the MO either the ASE or the seed laser pulse could be used. Voltage signals from the CP capacitors 82 can also be used as feedback signals for controlling the relative timing of discharges for the two chambers. Preferably the clock time when the voltages crosses a selected threshold would be used in the feedback calculation.

Bias Voltage Adjustment

The pulse timing can be increased or decreased by adjusting the bias currents through inductors $L_{B1}$ $L_{B2}$ and $L_{B3}$ which provide bias for inductors 48, 54 and 64 as shown in FIG. 5. Other techniques could be used to increase the time needed to saturate these inductors. For example, the core material can be mechanically separated with a very fast responding PZT element which can be feedback controlled based on a feedback signal from a pulse timing monitor.

Adjustable Parasitic Load

An adjustable parasitic load could be added to either or both of the pulse power circuits downstream of the CO's.

Additional Feedback Control

Charging voltage and inductor temperature signals, in addition to the pulse timing monitor signals can be used in feedback controls to adjust the bias voltage or core mechanical separation as indicated above in addition to the adjustment of the trigger timing as described above.

Burst Type Operation

Feedback control of the timing is relatively easy and effective when the laser is operating on a continuous basis. However, the present MOPA laser system described herein lithography light source will normally operate in a burst mode such as (for example) the following to process die spots on each of many wafers:

Off for 1 minute to move a wafer into place
4000 Hz for 0.2 seconds to illuminate area 1
Off for 0.3 seconds to move to area 2
4000 Hz for 0.2 seconds to illuminate area 2
Off for 0.3 seconds to move to area 3
4000 Hz for 0.2 seconds to illuminate area 3
4000 Hz for 0.2 seconds to illuminate area 199
Off for 0.3 seconds to move to area 200
4000 Hz for 0.2 seconds to illuminate area 200
Off for one minute to change wafers
4000 Hz for 0.2 seconds to illuminate area 1 on the next wafer, etc.

Figure 6F:
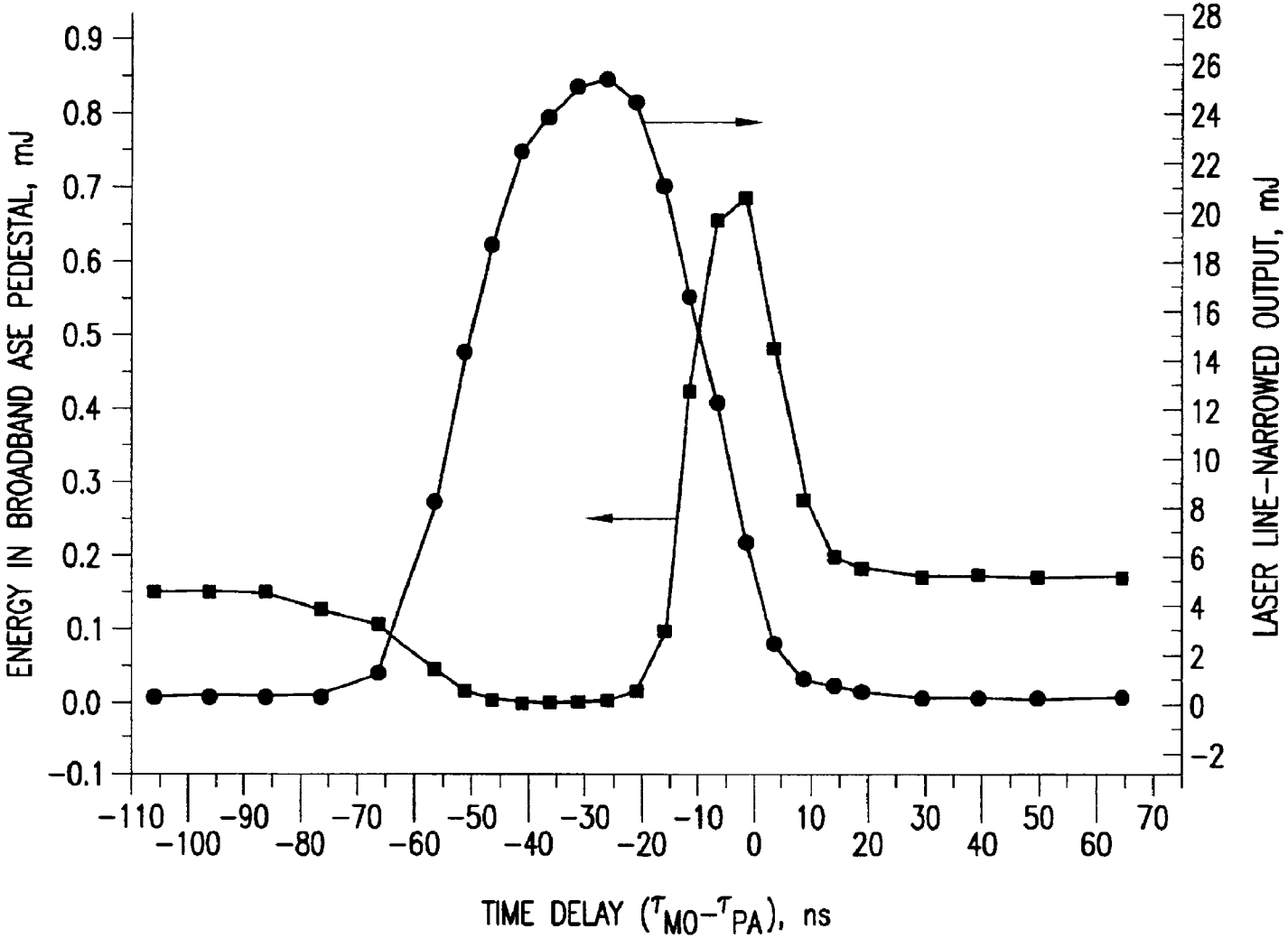
Figures 1, 6F:
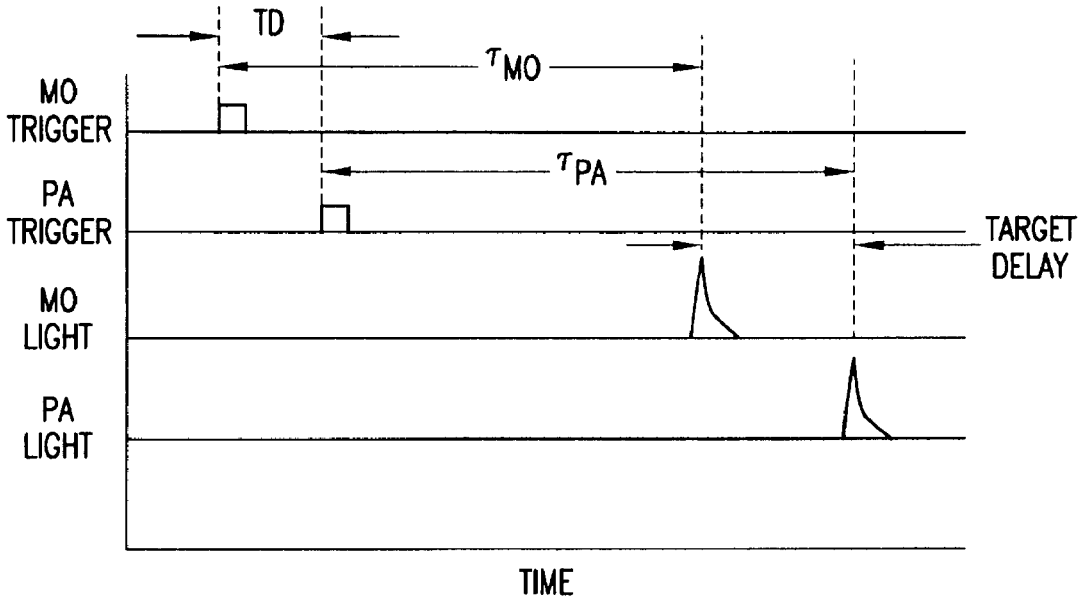
Figure 6G:
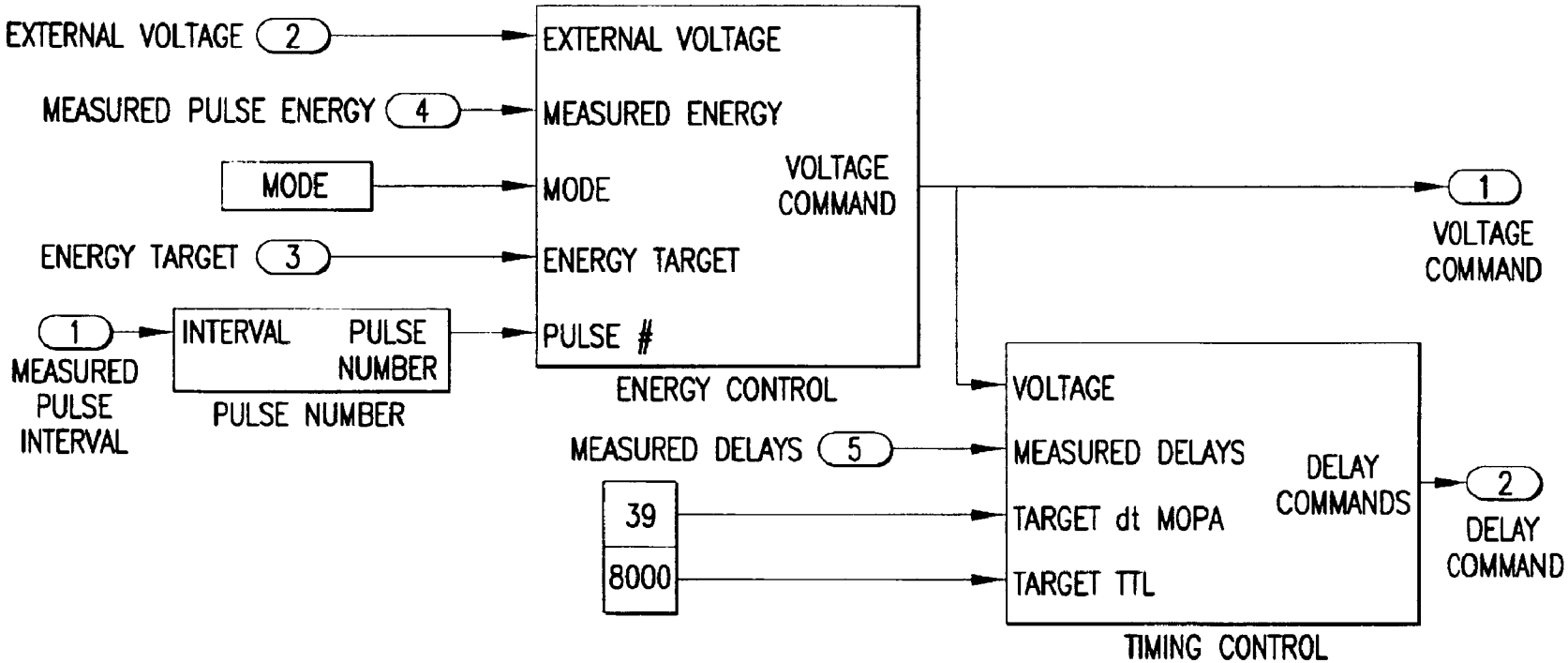
FIG. 6G shows elements of an energy control technique.
Figure 6H:
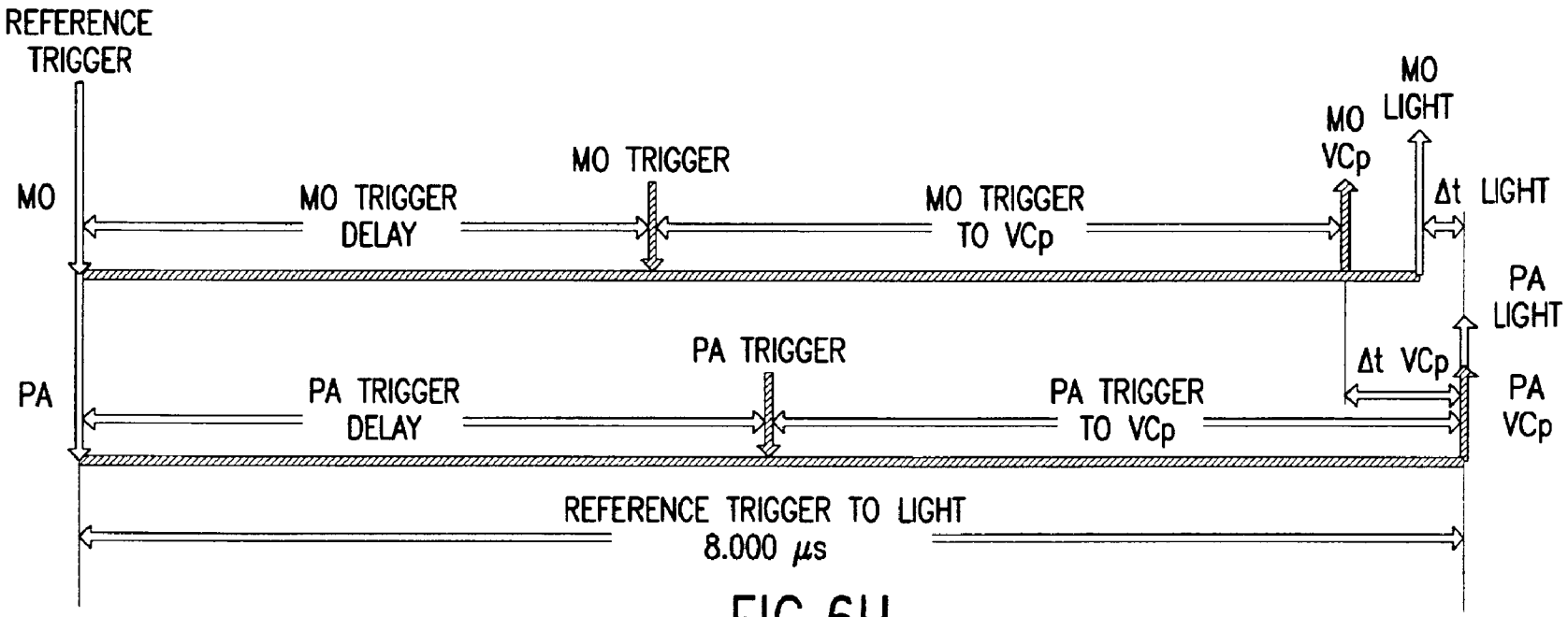
FIG. 6H shows a trigger control technique.
Figure 6J:
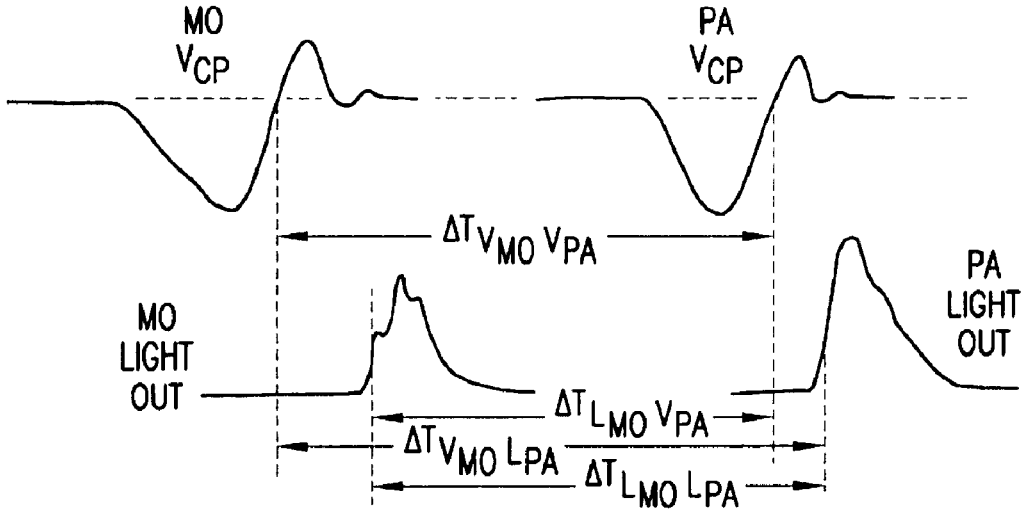
FIG. 6J shows the relationship between the voltage on Cp and light out in a MOPA system.
Figure 6I:
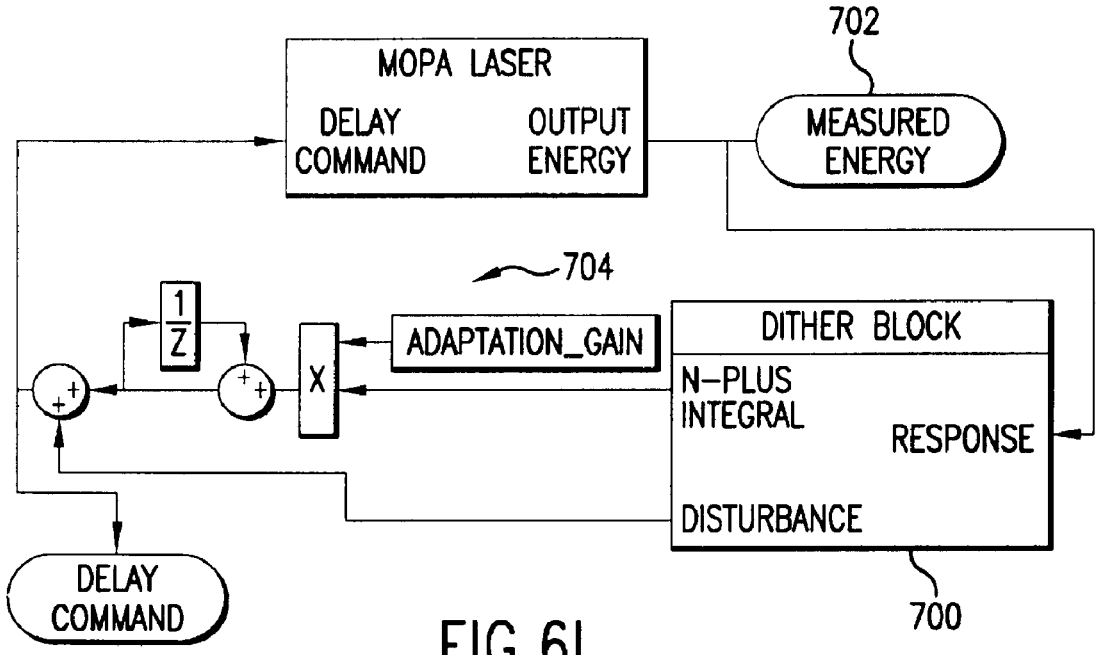
FIG. 6I illustrates a feedback timing control technique.
Figure 6K:
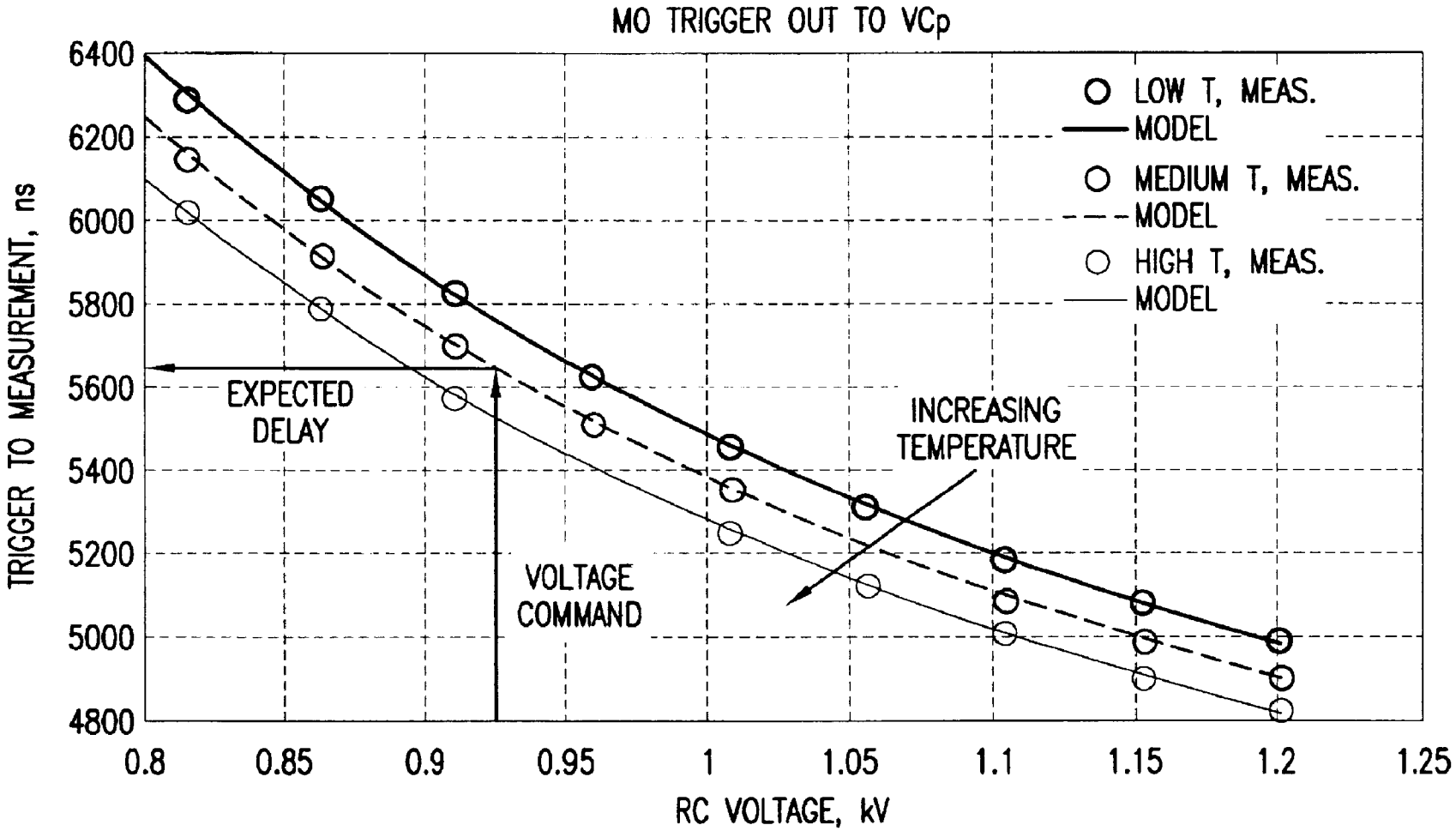
FIG. 6K shows the effect of inductor temperature on timing.

Thus, for any laser system such as the ones described herein, sets of data can be obtained from calibration tests and this data can be used to prepare graphs like that shown in FIG. 6K. The data can also be used to produce sets of bin values so that the trigger to discharge times can be determined based on measured temperature values and commanded charging voltages. It is also possible to infer inductor temperature from the operating history of the laser. Applicants have determined that data of the type shown in FIG. 6K can be utilized to derive a single algorithm relating discharge times to only two unknown: (1) charging voltage and (2) another parameter that Applicants call δ(T). With this algorithm established, the laser operator can merely collect a few sets of data providing average voltage and discharge time, and plug these numbers in the algorithm and value for δ(T). This value of δ(T) is then inserted into the algorithm and the algorithm then provides the discharge time merely as a function of charging voltage. In a preferred embodiment the δ(T) values are updated automatically with a computer processor periodically such as at 1000 pulse intervals or whenever there is a significant change in operating conditions. In this preferred embodiment the algorithm has the form:

$$MDt(V,\ \delta(T)) = \frac{\alpha}{V + \delta(T)v} + [\beta + \delta(T)b] + \gamma[V + \delta(T)v]$$

where MDt(V,δ(T)) is the discharge time for the MO and α, β, γ, ν and b are calibration constants.

This process may be repeated for many hours, but will be interrupted from time-to-time for periods longer than 1 minute. The length of down times will affect the relative timing between the pulse power systems of the MO and the PA and adjustment will often be required in the trigger control to assure that the discharge in the PA occurs when the seed beam from the MO is at the desired location. As shown in FIG. 1C and described above, by monitoring the trigger timing and the timing of light out from each chamber the laser operator can adjust the trigger timing (accurate to within less than 2 to 5 ns) to achieve best performance.

Preferably a laser control processor is programmed to monitor the timing and beam quality and adjust the timing automatically for best performance. Timing algorithms which develop sets of bin values for adjusting timing applicable to various sets of operating modes may be utilized in preferred embodiments of this invention. As described above and as shown in FIG. 6K the two most important parameters in determining the delay between trigger and discharge is the charging voltage and the temperature of the saturable inductors in the pulse power system. As indicated above, these algorithms are most useful when there is a change in the operating mode such resumption of operation after a long off period or if there is a substantial change in repetition rate or pulse energy. These algorithms may be designed to switch to strict feedback control during continuous operation or burst mode operation such as that described above where the timing values for the current pulse is set based on feedback data collected for one or more preceding pulse (such as the immediately preceding pulse).

Preferred Technique for Jitter Control

Applicants have tested several feedback methods for jitter control. These tested methods include feedback control based on timing signals using peaking capacitor voltage (i.e., voltage on peaking capacitor 82 for both MO and PA. The ΔT obtained by these two techniques are shown in FIG. 6J. A preferred technique based on the use of the Cp voltage is to use the time the voltage on the capacitor banks cross zero voltage as shown in FIG. 6J. For the light out techniques Applicants prefer to use the time when the light intensity detected crosses a threshold equal to about 10% of the typical maximum intensity.

Any combination of signals could be used for timing control. For example: (1) MOVcp and PA Vcp, (2) MO Vcp and PA Light Out, (3) MO Light Out and PA Vcp and (4) MO Light Out and PA Light Out. Applicants have determined that the fourth alternative (i.e., MO Light Out and PA Light Out) is the preferred feedback control technique, yielding the most consistent reliable results. Using the Vcp signals requires (for best results) adjustments of the ΔT values if there are significant changes in for $F_2$ concentration. No correction is required for $F_2$ concentration changes when both light out signals are used.

Dither to Determine Synchronization Delay

In a preferred embodiment of the present invention the timing control for discharge trigger for the two chambers is provided with a dither algorithm to assure approximately optimal timing. This improvement ensures that as conditions change to the timing control continuously searches for the most desirable timing delay. As shown in FIG. 6C for a typical MOPA configuration, the optimum delay for maximum laser efficiency (maximum laser output for constant discharge voltage) occurs when the time delay is about 39 ns. At ±10 ns the efficiency is down to about 70%.

FIG. 6I is simplified block diagram model of a timing dither portion of a preferred control system. A disturbing signal (preferably a single period of sine wave of arbitrary pulse length) is generated in a "Dither Generator" 700. This signal is added on top of the current delay command as the laser is fired. The output energy from each pulse is measured by monitor 702 in spectrum analysis monitor 9 as shown in FIG. 1 and fed back into dither block 700. An orthogonality integral is performed to extract the portion of the energy response due to the dither disturbance. As shown at 704 at the end of a complete period of the disturbance signal, the nominal delay command in updated in accordance with the results of the orthogonality integral.

As an example, the delay command might nominally be 35 ns. On top of this would be added a sine wave with 1 ns amplitude and 10 pulse period. If at the end of the ten pulses, the orthogonality integral indicates that the output efficiency is increased with increased delay time, the nominal delay would then be increased according to the gain setting. When at the optimal delay, the integral would yield zero, and no adjustment would be made.

Mathematically, the dither is implemented as follows:

1. The nominal delay command, $\Delta t_0$, is initially set to the presumed optimal delay value based on geometry. For an N-pulse dither, the actual delay command is the sum of the nominal command plus the sinusoidal perturbation:

$$\Delta t(i) = \Delta t_0 + \varepsilon \sin\left(\frac{2\pi(i-1)}{N}\right) \quad i = 1 \ldots N$$

2. The energy response, E(i), is recorded for each of the N pulses.
3. The orthogonality integral between disturbance and response is implemented as a discrete sum:

$$R = \sum_{i=1}^{N} E(i)\sin\left(\frac{2\pi(i-1)}{N}\right)$$

4. The nominal delay command is updated based on the result of the previous dither:

$$\Delta t_0 = \Delta t_0 + k \times R$$

Preferably, the first dither command is always zero under this construction: (choosing N=3 instead of 10 yields the 2 pulse dither pattern that has been used in previous systems for dE/dV estimation. The amplitude, $\epsilon$, of the dither signal should be chosen so as not to stand out in the output. It can be hidden below the level of the pulse-pulse energy noise, but still extracted via the orthogonality integral. The nominal value is not updated during the dither. It is fixed, and only updated after a dither disturbance cycle has completed. A variation on step 4 would be to use the sign of R to determine which direction to step to move toward the maximum. The dither disturbance could be applied continuously or occasionally, depending on how fast the laser operator thinks the optimal value changes.

Feedback Timing Data Without Laser Output

Timing algorithms such as those discussed above work very well for continuous or regularly repeated operation. However, the accuracy of the timing may not be good in unusual situations such as the first pulse after the laser is off for an unusual period of time such as 5 minutes. In some situations imprecise timing for the first one or two pulses of a burst may not pose a problem. A preferred technique is to preprogram the laser so that the discharges of the MO and the PA are intentionally out of sequence for one or two pulses so that amplification of the seed beam from the MO is impossible. Techniques for obtaining timing data for feedback control without producing significant laser output are discussed in the next two sections.

Applicants Test

Applicants have conducted careful experiments to measure the impact of the relative timing of the discharge of the master oscillator and the power amplifier. These tests are summarized in FIG. 6F in which the Applicants have plotted the pulse energy (in millijoules) of amplified stimulated emission (ASE) from the output of the power amplifier and the line narrowed output (also in millijoules) from the MO and amplified in the PA. Both plots are made as a function of delay between the beginning of discharge of the master oscillator and the beginning of discharge of the power amplifier. Beginning of discharge signals were taken from photo cells at the MO and PA monitoring the light output from each of the chambers to determine the time selected thresholds are exceeded. The time values plotted in FIG. 6F are displayed in FIG. 6F1. The reader should note that the energy scale of the ASE is smaller than that for the line narrowed light output.

Lithography customer specifications call for the ASE to be a very small fraction of the line narrowed laser output. A typical specification calls for the ASE to be less than $5\times10^{-4}$ times the line narrowed energy for a thirty pulse window. As is shown in FIG. 5 the ASE is substantially zero when the narrow band pulse is maximum; i.e., in this case when the MO discharge precedes the PA discharge by between 25 and 40 ns. Otherwise, the ASE becomes significant.

As described above, the MO and the PA pulse power circuits can be triggered with a timing accuracy of less than about 2 ns so with good feedback information regarding the response of the two pulse power circuits, the MO and the PA can be discharged within the range where line narrowed pulse energy is maximum and ASE is insignificant. Therefore, for continuous operation with good feedback control, control of the two systems is relatively easy. However, typical operation of these lasers is burst mode operation as described above. Therefore, the first pulse of a burst could possibly produce bad results because any feedback data could be significantly out of date and temperature changes in the electrical components may affect their responses.

Other Techniques for Collecting Feedback Timing Data

One solution is to initiate a test pulse prior to each burst (perhaps with the laser shutter closed) so that up-to-date timing data can be obtained. This solution will typically not be preferred for several reasons including the delay associated with closing and opening the shutter.

A better solution is the one referred to briefly above in which the two chambers are caused to discharge at relative times chosen so that there can be no amplification of the output of the MO. From FIG. 6F we can see that essentially zero narrowband output will result from triggering the PA earlier than about 20 ns prior to the triggering of the MO or later than about 70 ns after the triggering of the MO. The ASE in both situations is about 0.15 mJ as compared to the pulse energies of about 25 mJ if the timing of the two discharges is chosen for maximum output. Applicants' preferred timing for essentially zero output discharges is to trigger the PA at least 110 ns after the trigger of the MO. Good targets for example, would be to trigger PA 200 ns after the MO trigger or 100 ns before the MO trigger.

In one technique if more than one minute has elapsed since the previous pulse, the PA is discharged 200 ns after the MO is discharged. Otherwise the PA is discharged 30 to 50 ns after the MO is discharged using most recent feedback data as described above to produce the desired pulse energy. The technique calls for collecting timing data, and feedback corrections are made for any changes in timing between trigger and discharge. The discharge are detected by photocells detecting discharge beyond a selected threshold produced ASE light in both the MO and the PA as indicated above. In another technique if more than one minute has elapsed since the previous pulse, the MO is discharged 40 ns after the discharge of the PA. As before, timing data is collected and used to assure that discharges subsequent to the first pulse occur when they should to produce maximum or desired narrow band output and minimum ASE.

Thus, the first pulse of each burst after more than a one minute idle time produces substantially zero line narrowed output and an extremely small amount of ASE. Applicants estimate that the ASE for pulse windows of at least 30 pulses, the ASE will be less than $2\times10^{-4}$ of the integrated narrow band energy. Since pulses in this preferred laser are at the rate of 4000 pulses per second, the loss of a single pulse at the beginning of a burst of pulses is not expected to be a problem for the laser users.

Variations

Many modifications could be made to the procedures outline above to achieve similar results. The time values such as the 30 second targets shown of course should be chosen to provide best results. The 1 minute could be as small as a few milliseconds so that the first pulse of each burst is thrown away. In the first technique referred to above, the 110 ns time period could be shortened to as much as about 70 ns and in the second technique situation the 40 ns time period could be as short as about 20 ns. The programs could be modified to provide for two or several no output discharges at the start of each burst or at the start of each burst following an extended idle period. Parameters other than the P-cell outputs threshold could be used to determine the times of beginning of discharge. For example, the peaking capacitor voltage could be monitored. The sudden drop in voltage soon after the beginning of discharge could be used as the time of start of discharge.

Quick Connections

In this preferred embodiment, three of the pulse power electrical modules utilize blind mate electrical connections so that all electrical connections to the portions of the laser system are made merely by sliding the module into its place in the laser cabinet. These are the AC distribution module, the power supply module and the resonant charges module. In each case a male or female plug on the module mates with the opposite sex plug mounted at the back of the cabinet. In each case two approximately 3-inch end tapered pins on the module guide the module into its precise position so that the electrical plugs properly mate. The blind mate connectors such as AMP Model No. 194242-1 are commercially available from AMP, Inc. with offices in Harrisburg, Pa. In this embodiment connectors are for the various power circuits such as 208 volt AC, 400 volt AC, 1000 Volt DC (power supply out and resonant charges in) and several signal voltages. These blind mate connections permit these modules to be removed for servicing and replacing in a few seconds or minutes. Lever handles such as are described in U.S. Pat. No. 4,440,431 incorporated herein by reference may be used to provide good connection and to make removal easier. In this embodiment blind mate connections are not used for the commutator module the output voltage of the module is in the range of 20 to 30,000 volts. Instead, a typical high voltage connector is used.

Pulse and Dose Energy Control

Pulse energy and dose energy are preferably controlled with a feedback control system and algorithm such as that described above. The pulse energy monitor can be at the laser as closer to the wafer in the lithography tool. Using this technique charging voltages are chosen to produce the pulse energy desired.

Applicants have determined that this technique works very well and greatly minimize timing jitter problems. This technique, however, does reduce to an extent the laser operator's ability to control the MO independently of the PA. However, there are a number of operating parameters of the MO and the PA that can be controlled separably to optimize performance of each unit. These other parameters include: laser gas pressure, $F_2$ concentration and laser gas temperature, These parameters preferably are controlled independently in each of the two chambers and regulated in processor controlled feedback arrangements.

Gas Control

The preferred embodiment of this invention has a gas control module as indicated in FIG. 1 and it is configured to fill each chamber with appropriate quantities of laser gas. Preferably appropriate controls and processor equipment is provided to inject fluorine periodically or to maintain continuous flow or nearly continuous flow of gas into each chamber so as to maintain laser gas concentrations constant or approximately constant at desired levels. This may be accomplished using techniques such as those described in U.S. Pat. No. 6,028,880, U.S. Pat. No. 6,151,349 or U.S. Pat. No. 6,240,117 (each of which are incorporated herein by reference). In one embodiment about 3 kP of fluorine gas (comprised of, for example, 1.0% $F_2$, 3.5% Ar and the rest neon for the Arf laser) is added to each chamber each 10 million pulses. (at 4000 Hz continuous operation this would correspond to an injection each approximately 42 minutes.) Periodically, the laser is shut down and the gas in each chamber is evacuated and the chambers are refilled with fresh gas. Typical refills are at about 100,000,000 pulses for ArF and about 300,000,000 for KrF.

A technique for providing substantially continuous flow of laser gas into the chambers which Applicants call its binary fill technique is to provide a number (such as 5) fill lines each successive line orificed to permit double the flow of the previous line with each line having a shut off valve. The lowest flow line is orificed to permit minimum equilibrium gas flow. Almost any desired flow rate can be achieved by selecting appropriate combinations of valves to be opened. Preferably a buffer tank is provided between the orificed lines and the laser gas source which is maintained at a pressure at about twice the pressure of the laser chambers.

Gas injections can also be automatically made when charging voltage levels reach predetermined values. These predetermined levels may be established by the performance of laser efficiency tests or they may be established by tests performed in the course of gas refills. For the MO the predetermined voltage levels may be established based on bandwidth and efficiency tradeoffs.

Variable Bandwidth Control

As described above, this preferred embodiment of the present invention produces laser pulses much more narrow than prior art excimer laser bandwidths. In some cases, the bandwidth is more narrow than desired giving a focus with a very short depth of focus. In some cases, better lithography results are obtained with a larger bandwidth. Therefore, in some cases a technique for tailoring the bandwidth will be preferred. Such techniques are described in detail in U.S. patent application Ser. Nos. 09/918,773 and 09/608,543, which are incorporated herein by reference. These techniques involves use of computer modeling to determine a preferred bandwidth for a particular lithography results and then to use the very fast wavelength control available with the PZT tuning mirror control shown in FIGS. 16B1 and 16B2 to quickly change the laser wavelength during a burst of pulses to simulate a desired spectral shape. This technique is especially useful in producing relatively deep holes in integrated circuits.

Controlling Pulse Energy, Wavelength and Bandwidth

Prior art excimer lasers used for integrated circuit lithography are subject to tight specifications on laser beam parameters. This has typically required the measurement of pulse energy, bandwidth and center wavelength for every pulse and feedback control of pulse energy and center wavelength. In prior art devices the feedback control of pulse energy has been on a pulse-to-pulse basis, i.e., the pulse energy of each pulse is measured quickly enough so that the resulting data can be used in the control algorithm to control the energy of the immediately following pulse. For a 1,000 Hz system this means the measurement and the control for the next pulse must take less than 1/1000 second. For a 4000 Hz system speeds need to be four times as fast. A technique for controlling center wavelength and measuring wavelength and bandwidth is described in U.S. Pat. No. 5,025,455 and in U.S. Pat. No. 5,978,394. These patents are incorporated herein by reference. Additional wavemeter details are described in co-owned patent application Ser. No. 10/173,190 which is also incorporated by reference herein.

Control of beam parameters for this preferred embodiment is also different from prior art excimer laser light source designs in that the wavelength and bandwidth of the output beam is set by conditions in the master oscillator 10 whereas the pulse energy is mostly determined by conditions in the power amplifier 12. In a preferred embodiment, wavelength bandwidths is measured in the SAM 9. This equipment in the SAM for measuring bandwidth utilizes an etalon and a linear diode array as explained in the above-referenced patents and patent applications. However an etalon with a much smaller free spectral range is utilized in order to provide much better bandwidth resolution and tracking of the bandwidth. Pulse energy is monitored in both the LAM and the SAM and may also be monitored at the scanner. Pulse energy may also be monitored just downstream of pulse stretcher 12, in each case using pulse energy monitors as described in the above patents and patent applications. These beam parameters can also be measured at other locations in the beam train.

Feedback Control of Pulse Energy and Wavelength

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein. The energy of each pulse in each burst is measured by photo diode monitor 623 after pulse stretcher 12 and these measurements are used to control pulse and dose. The rate of change of pulse energy with charging voltage is determined. A pulse energy error is determined for a previous pulse of the present burst. An integrated dose error is also determined for all previous pulses in a moving pulse window (such as the most recent 30 pulses). A charging voltage for the next pulse is determined using the pulse energy error, the integrated dose error, the rate of change of energy with charging voltage and a reference voltage. In a preferred embodiment, the rate of change of energy with voltage is determined by dithering the voltage during two pulses of each burst, once lower and once higher. The reference voltage is a voltage calculated using prior energy and voltage data. In this embodiment, the method of determining the reference voltage during a first portion of the burst is different from the method used during a latter portion of the burst. During a first set of pulses (40 in a preferred embodiment), for each pulse, a specified voltage calculated using voltage and energy data from a corresponding pulse in a previous burst is utilized as a prediction of the voltage needed to produce a pulse energy converging on a target pulse energy. For pulses 41 and thereafter the reference voltage for each pulse is the specified voltage for the previous pulse.

Centerline wavelength of the laser as described above may be controlled in a feedback arrangement using measured values of wavelengths at the LAM at the output of the MO and techniques known in the prior art such as those techniques described in U.S. Pat. No. 5,978,394, Wavelength System for an Excimer Laser also incorporated herein by reference. Applicants have recently developed techniques for wavelength tuning which utilize a piezoelectric driver to provide extremely fast movement of tuning mirror. Some of these techniques are described in U.S. patent application Ser. No. 608,543, Bandwidth Control Technique for a Laser, filed Jun. 30, 2000 which is incorporated herein by reference. The following section provides a brief description of these techniques. A piezoelectric stack adjusts the position of the fulcrum of the lever arm.

New Lnp With Combination Pzt-Stepper Motor Driven Tuning Mirror

Detail Design with Piezoelectric Drive

FIG. 3 is a block diagram showing features of the laser system which are important for controlling the wavelength and pulse energy of the output laser beam. In this case the wavelength is controlled by the MO so the laser chamber shown in FIG. 3 represents the MO chamber.

Line narrowing is done by a line narrowing module 110 (designated as 10B in FIG. 1) which contains a four prism beam expander (112a-112d), a tuning mirror 114, and a grating 10C3. In order to achieve a very narrow spectrum, very high beam expansion is used in this line narrowing module. This beam expansion is 45× as compared to 20×-25× typically used in prior art microlithography excimer lasers. In addition, the horizontal size of front (116a) and back (116B) apertures are made also smaller, i.e., 1.6 and 1.1 mm as compared to about 3 mm and 2 mm in the prior art. The height of the beam is limited to 7 mm. All these measures allow to reduce the bandwidth from about 0.5 pm (FWHM) to about 02 pm (FWHM). The laser output pulse energy is also reduced, from 5 mJ to about 1 mJ. This, however, does not present a problem, because this light will be amplified in the amplifier to get the 10 mJ desired output. The reflectivity of the output coupler 118 is 30%, which is close to that of prior art lasers.

FIG. 3A is a drawing showing detail features of a preferred wavelength tuning technique. Large changes in the position of mirror 14 are produced by stepper motor through a 26.5 to 1 lever arm 84. In this case a diamond pad 81 at the end of piezoelectric drive 80 is provided to contact spherical tooling ball at the fulcrum of lever arm 84. The contact between the top of lever arm 84 and mirror mount 86 is provided with a cylindrical dowel pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in a mirror mount with a three-point mount using three aluminum spheres, only one of which are shown in FIG. 3B. Three springs 14A apply the compressive force to hold the mirror against the spheres. Embodiments may include a bellows (which functions as a can) to isolate the piezoelectric drive from the environment inside the LNP. This isolation prevents UV damage to the piezoelectric element and avoid possible contamination caused by out-gassing from the piezoelectric materials. This design has been proven successful in correcting wavelength "chirp" which is naturally occurring wavelength changes occurring over time periods of about 5 to 10 milliseconds during its first 30 millisecond of bursts.

Pretuning and Active Tuning

In some cases the operator of a integrated circuit lithography machine may desire to change wavelength on a predetermined basis. In other words the target center wavelength $\lambda_T$ may not be a fixed wavelength but could be changed as often as desired either following a predetermined pattern or as the result of a continuously or periodically updating learning algorithm using early historical wavelength data or other parameters.

Adaptive Feedforward

Preferred embodiments of the present invention includes feedforward algorithms. These algorithms can be coded by the laser operator based on known burst operation patterns. Alternatively, this algorithm can be adaptive so that the laser control detects burst patterns such as those shown in the above charts and then revises the control parameters to provide adjustment of mirror 14 in anticipation of wavelength shifts in order to prevent or minimize the shifts. The adaptive feedforward technique involves building a model of the chirp at a given rep rate in software, from data from one or more previous bursts and using the PZT stack to invert the effect of the chirp.

To properly design the chirp inversion, two pieces of information are needed: (1) the pulse response of the PZT stack, and (2) the shape of the chirp. For each repetition rate, deconvolution of the chirp waveform by the pulse response of the PZT stack will yield a sequence of pulses, which, when applied to the PZT stack (with appropriate sign), will cancel the chirp. This computation can be done off line through a survey of behavior at a set of repetition rates. The data sequences can be saved to tables indexed by pulse number and repetition rate. This table could be referred to during operation to pick the appropriate waveform data to be used in adaptive feedforward inversion. It is also possible, and in fact may be preferable, to obtain the chirp shape model in almost real-time using a few bursts of data at the start of operation each time the repetition rate is changed. The chirp shape model, and possibly the PZT pulse response model as well, could then be updated (e.g. adapted) every N-bursts based on accumulated measured error between model and data.

The chirp at the beginning of bursts of pulses can be controlled using an algorithm and technique as described in U.S. patent application Ser. No. 10/012,002 which has been incorporated by reference herein.

Vibration Control

In preferred embodiments active vibration control can be applied to reduce adverse impacts resulting from chamber generated vibrations. One such technique utilizes a piezoelectric load cell to monitor LNP vibrations to provide a feedback signal used to provide additional control functions to the $R_{max}$ mirror. This technique is described in U.S. patent application Ser. No. 09/794,782 incorporated by reference herein.

Other Bandwidth Measuring Techniques

The bandwidth of the laser beam from preferred embodiments of the present invention are substantially reduced compared to prior art lithography lasers. In an above section Applicants described a technique for utilizing an etalon having a free spectral range of about three times that of prior art bandwidth measuring etalons. This technique approximately doubles the precision of the bandwidth measurements. It may be desirable to provide metrology systems for providing even greater accuracy in bandwidth measurement than is provided by the above-described systems. One such method is described in U.S. patent application Ser. No. 10/003,513 filed Oct. 31, 2001 entitled "High Resolution Etalon Grating Spectrometer", which is incorporated by reference herein. Other high accuracy methods for measuring bandwidth, both full width half maximum and the 95% integral bandwidth can be incorporated either as a laser component or provided as test equipment.

Pulse Stretcher

Integrated circuit scanner machines comprise large lenses which are difficult to fabricate and costs millions of dollars. These very expensive optical components are subject to degradation resulting from billions of high intensity and ultraviolet pulses. Optical damage is known to increase with increasing intensity (i.e., light power (energy/time) per $cm^2$ or $mJ/ns/cm^2$) of the laser pulses. The typical pulse length of the laser beam from these lasers is about 20 ns so a 5 mJ beam would have a pulse power intensity of about 0.25 mJ/ns. Increasing the pulse energy to 10 mJ without changing the pulse duration would result a doubling of the power of the pulses to about 0.5 mJ/ns which could significantly shorten the usable lifetime of these expensive optical components. The Applicants have avoided this problem by increasing substantially the pulse length from about 20 ns to more than 50 ns providing a reduction in the rate of scanner optics degradation. This pulse stretching is achieved with pulse stretcher unit 12 as shown in FIG. 1. A beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump of a corresponding stretched pulse in of beam 14C. The stretched beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of a second hump in the laser pulse. The 40 percent of the reflected beam transmits beam splitter 14 and follows exactly the path of the first reflected beam producing additional smaller humps in the stretched pulse. The result is stretched pulse 14C which is stretched in pulse length from about 20 ns to about 50 ns.

The stretched pulse shape with this embodiment has two large approximately equal peaks 13A and 13B with smaller diminishing peaks following in time the first two peaks. The shape of the stretched pulse can be modified by using a different beam splitter. Applicants' have determined that a beam splitter reflecting about 60 percent produces the maximum stretching of the pulse as measured by a parameter known as the "time integrated square" pulse length or "TIS". Use of this parameter is a technique for determining the effective pulse duration of pulses having oddly shaped power vs. time curves. The TIS defined as:

$$t_{IS} = \frac{\left(\int I(t)dt\right)^2}{\int I^2(t)dt}.$$

Where I(t) is the intensity as a function of time.

In order to maintain the beam profile and divergence properties, the mirrors that direct the beam through the delay propagation path must create an imaging relay system that also should act as a unity, magnification, focal telescope. The reason for this is because of the intrinsic divergence of the excimer laser beam. If the beam were directed through a delay path without being imaged, the beam would be a different size than the original beam when it is recombined at the beam splitter. To create the imaging relay and afocal telescope functions of the pulse stretcher the mirrors are designed with a specific radius of curvature which is determined by the length of the delay path. The separation between mirrors 20A and 20D is equal to the radius of curvature of the concave surfaces of the mirrors and is equal to ¼ the total delay path.

The relative intensities of the first two peaks in the stretched pulse can be modified with the design of the reflectivity of the beam splitter. Also, the design of the beam splitter and therefore the output TIS of the pulse stretcher are dependent upon the efficiency of the beam relay system and therefore the output TIS is also subject to the amount of reflectivity of the imaging relay mirrors and the amount of loss at the beam splitter. For an imaging relay mirror reflectivity of 97% and a loss of 2% at the beam splitter, the maximum TIS magnification occurs when the reflectivity of the beam splitter is 63%.

The alignment of the pulse stretcher requires that two of the four imaging relay mirrors be adjustable. Each of the two adjustable mirrors would have tip/tilt adjustment creating a total of four degrees of freedom. It is necessary that the two adjustable mirrors be located at opposite ends of the system because of the confocal design of the system. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher. By examining the overlay of the sub-pulses with the original pulse at two planes (near field and far field) one would have the necessary information to automatically adjust the mirrors to produce an output where each of the sub-pulses propagate in a co-linear manner with the original pulse.

Relay Optics

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, MO WEB, 24, power amplifier wavefront engineering box, PA WEB, 26 and beam reverser, BR, 28. These three modules along with line narrowing module 8B and output coupler 8A are all mounted on a single vertical optical table independent of discharge chamber 8C and the discharge chamber of power amplifier 10. Chamber vibrations caused by acoustic shock and fan rotation must be isolated from the optical components.

The optical components in the master oscillator line narrowing module and output coupler are in this embodiment substantially the same as those of prior art lithography laser light sources referred to in the background section. The line narrowing module includes a three or four prism beam expander, a very fast response tuning mirror and a grating disposed in Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB contains a total internal reflection (TIR) prism and alignment components for precisely directing the output beam 14A into the PA WEB. TIR prisms such as the one shown in FIG. 3A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism.

The PA WEB 26 contains a TIR prism and alignment components (not shown) for directing laser beam 14A into a first pass through power amplifier gain medium. Alternatively, as above a first surface mirror with a high reflection coating could be substituted for the TIR prism. The beam reverser module 28 contains a two-reflection beam reversing prism relies on total internal reflection and therefore requires no optical coatings. The face where the P-polarized beam enters and exits the prism is oriented at Brewster's angle to minimize reflection lasers, making the prism almost 100% efficient.

After reversal in the beam reversing module 28, partially amplified beam 14A makes another pass through the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier discharge chamber. The first pass follows a path at an angle of about 6 milliradians relative to the path of the second pass and the first path of the first pass crosses the center line of the gain medium at a point half way between the two ends of the gain medium.

Beam Expansion Prisms

Coming out of the PA, the fluence of the beam is higher than anywhere else in the system (due to small beam size and high pulse energy). To avoid having such high fluence incident on the optical coatings in the OPuS module, where coating damage could result, beam expansion prisms were designed into the PA WEB. By expanding the horizontal beam width by a factor of 4, the fluence is reduced to ¼ its previous level.

The beam expansion is accomplished using a pair of identical prisms with 20° apex angle.

The prisms are made of ArF-grade calcium fluoride and are uncoated. By utilizing an incidence angle of 68.6° on each prism, anamorphic magnification of 4.0 is achieved, and the nominal deviation angle of the pair is zero. The total Fresnel reflection loss from the four surfaces is about 12%.

Beam Delivery Unit

In this preferred embodiment a pulsed laser beam meeting requirements specified for the scanner machine 2 is furnished at the light input port of the scanner. A beam analysis module as shown at 38 in FIG. 1 called a BAM is provided at the input port of the scanner to monitor the incoming beam and providing feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module on a pulse to pulse basis at pulse rates up to 4,000 Hz using techniques described in U.S. patent application Ser. No. 10/012,002 which has been incorporated herein by reference.

Other beam parameters may also be monitored at any desired frequency since these other parameters such as polarization, profile, beam size and beam pointing are relatively stable, may be normally monitored much less frequently than the wavelength, bandwidth and pulse energy parameters.

This particular BDU comprises two beam-pointing mirrors 40A and 40B one or both of which may be controlled to provide tip and tilt correction for variations beam pointing. Beam pointing may be monitored in the BAM providing feedback control of the pointing of one or both of the pointing mirrors. In a preferred embodiment piezoelectric drivers are provided to provide pointing response of less than 7 milliseconds.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam.

Noise Reduction

Preferred embodiments include four improvements for minimizing noise effects in the controls for the laser system. (1) Processors are programmed to avoid transmittal of data on inter-module links during the approximately 5 microseconds while the laser is firing. (2) With the CAN system shown in FIG. 1C, cluster controllers are located at sensors and actuators and contain A to D and/or D to A converters so that transmittal of data between modules can be in serial digital form with error detection. The CAN equipment including device net boards is available from suppliers such as Woodhead Connectivity. (3) Processors can also be programmed to avoid D to A conversion while the laser is firing. (4) Intermodule links are shielded twisted pair conductors.

Various modifications may be made to the present invention without altering its scope. Those skilled in the art will recognize many other possible variations.

For lithography either ArF, KrF or $F_2$ systems could be utilized. This invention may also be applied to uses other than lithography in which light at ultraviolet wavelength may be needed. When the laser system is configured as an $F_2$ laser the line narrowing unit as shown at 110 in FIG. 3 would preferably be replaced with a line selection module comprised of one or more prisms and a total reflection mirror. An important improvement here is the addition of equipment to a laser system to deliver an ultraviolet laser beam having desire beam qualities to an input port of a equipment needing an ultraviolet laser light source. Various feedback control arrangements other than those referred to herein could be used. For laser systems including a beam delivery unit such as 6 in FIG. 1 two actively control tilt-tip mirrors can be added as shown with these mirrors controlled with a feedback arrangement to keep the output beam properly positioned.

The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many other laser layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers.

Accordingly, the above disclosure is not intended to be limiting and the scope of the invention should be determined by the appended claims and their legal equivalents.

We claim:

1. A two chamber high repetition rate gas discharge laser system comprising:

A) a first laser unit comprising:
  1) a first discharge chamber containing;
    a) a first laser gas and
    b) a first pair of elongated spaced apart electrodes defining a first discharge region,
  2) a first fan for producing sufficient gas velocities of said first laser gas in said first discharge region to clear from said first discharge region, following each pulse, substantially all discharge produced ions prior to a next pulse when operating at a repetition rate in the range of 4,000 pulses per second or greater,
  3) a first heat exchanger system capable of removing [at least 16 kw of] heat energy from said first laser gas,
  4) a line narrowing unit for narrowing spectral bandwidths of light pulses produced in said first discharge chamber;

B) a second discharge chamber comprising:
  1) a second laser gas,
  2) a second pair of elongated spaced apart electrodes defining a second discharge region
  3) a second fan for producing sufficient gas velocities of said second laser gas in said second discharge region to clear from said second discharge region, following each pulse, substantially all discharge produced ions prior to a next pulse when operating at a repetition rate in the range of 4,000 pulses per second or greater,
  4) a second heat exchanger system capable of removing [at least 16 kw of] heat energy from said second laser gas;

C) a pulse power system configured to provide electrical pulses to said first pair of electrodes and to said second pair of electrodes sufficient to produce laser pulses at rates of about 4,000 pulses per second with precisely controlled pulse energies in excess of about 5 mJ;

D) relay optics for directing laser beams produced in said first laser unit through said second discharge chamber to produce an amplified output beam; and E) a laser beam control system for measuring pulse energy, wavelength and bandwidth and controlling beam quality parameters of laser beams produced by said laser system.

2. A laser system as in claim 1 wherein said pulse power system comprises a first pulse compression circuit for providing high voltage electric pulses to said first pair of electrodes and a second pulse compression circuit for providing high voltage electric pulses to said second pair of electrodes.

3. A laser system as in claim 2 wherein said first pulse compression circuit comprises a first charging capacitor bank and a first discharge switch and said second pulse compression circuit comprises a second charging capacitor bank and a second discharge switch.

4. A laser system as in claim 3 and further comprising a fist charging means for charging said first and second charging capacitor banks in parallel to the same or substantially the same potential in less than 250 microseconds.

5. A laser system as in claim 4 wherein said fast charging means is a resonant charger.

6. A laser as in claim 3 and further comprising a trigger timing means for triggering said first and second discharge switches so as to produce electric discharges in said first and second discharge regions with a relative timing accuracy of about 2 to 5 billionths of a second.

7. A laser system as in claim 6 wherein said trigger timing means comprises a timing and energy module with trigger circuits for providing trigger signals to said first and second discharge switches with a relative timing accuracy better than 250 ps and providing light out signals representing light from said first and second chambers with a relative accuracy better than 250 ps.

8. A laser system as in claim [1] *6* wherein said trigger timing means comprises a computer processor for analyzing feedback signals representative of discharges in said first chamber and in said second chamber and for calculating trigger times for said first and second discharge switches so as to cause discharges in said first and second chamber timed to produce desired quality output pulses.

9. A laser as in claim 7 wherein said trigger timing means comprises a processor for producing clock pulses and a ramp voltage between clock pulses so as to permit accurate measurement of time in intervals between the clock pulses.

10. A laser system as in claim 8 wherein said feedback signals representative of discharges comprise at least one light out time event.

11. A laser system as in claim 8 wherein said feedback signals representative of discharges comprise at least two light out time event.

12. A laser system as in claim 8 wherein said feedback signals representative of discharges comprise at least one time event corresponding to a threshold crossing of a voltage potential signal representing electrical potential of a peaking capacitor bank.

13. A laser system as in claim 8 wherein said computer processor is programmed with an algorithm for generating charging voltage dithers and for determining desired trigger timing by analyzing feedback parameters affected by said dithers.

14. A laser system as in claim 1 and further comprising a beam delivery unit and at least one tilt tip mirror for maintaining laser output beams within a desired range.

15. A laser system as in claim 5 wherein said resonant charges comprises a De-Qing circuit.

16. A laser system as in claim 5 wherein said resonant charges comprises a bleed-down circuit.

17. A laser system as in claim 2 wherein said first and said second pulse compression circuits each comprise liquid cooled saturable indictors.

18. A laser system as in claim 16 wherein said liquid cooled saturable inductors of said first pulse compression circuit are substantially identical to corresponding liquid cooled saturable inductors in said second pulse compression circuit.

19. A laser system as in claim 1 wherein said laser gas krypton, fluorine and a buffer gas.

20. A laser system as in claim 1 wherein said laser gas comprises argon, fluorine and a buffer gas.

21. A laser system as in claim 1 wherein said laser gas comprises fluorine and said line narrowing unit is a line selection unit.

22. A laser system as in claim 1 wherein said first and second laser units are configured as a MOPA system wherein said first laser unit is a master oscillator and said second laser unit is a power amplifier.

23. A laser system as in claim 19 wherein said first and second laser gases comprise fluorine with said first laser gas having a substantially lower fluorine concentrations as compared to said second laser gas.

24. A laser system as in claim 22 wherein the fluorine concentration in said master oscillator is controlled in order to control bandwidth of said laser beams.

25. A laser system as in claim 21 wherein said line narrowing unit comprises at least four beam expanding prisms, a tuning mirror and a grating.

26. A laser system as in claim 23 wherein said line narrowing further comprises a stepper motor and a piezoelectric driver for tuning said tuning mirror.

27. A laser system as in claim 23 wherein said line narrowing unit is purged with helium.

28. A laser system as in claim [1] *22* wherein said power amplifier is configured for at least two beam passages through said second discharge region.

29. A laser system as in claim 1 and further comprising a gas control means for controlling fluorine concentration separately in said first discharge chamber and in said second discharge chamber.

30. A laser system as in claim [28] *29* wherein said gas control means is configured for continuous or almost continuous injections of fluorine in each discharge chamber.

31. A laser system as in claim 1 wherein said laser control system comprises a control processing unit configured as a master control of said laser system.

32. A laser system as in claim 30 wherein said master control comprises input ports for instructions from a lithography machine.

33. A laser system as in claim 1 and further comprising a control area network (CAN) having a plurality of CAN clusters.

34. A laser system as in claim 1 and also comprising a pulse stretcher for increasing pulse length of laser pulses.

35. A laser system as in claim 1 and further comprising a processor programmed to prevent transmittal of specified data during laser discharge.

36. A laser system as in claim [1] *35* wherein said processor is also programmed to prevent A/D conversion during said discharges.

37. A laser system as in claim 33 wherein said CAN is configured to transmit data in serial digital form with error detection.

38. A laser system as in claim 1 and further comprising a processor programmed to discard data obtained during discharges.

* * * * *